(12) United States Patent
Keser et al.

(10) Patent No.: US 9,679,873 B2
(45) Date of Patent: Jun. 13, 2017

(54) LOW PROFILE INTEGRATED CIRCUIT (IC) PACKAGE COMPRISING A PLURALITY OF DIES

(71) Applicant: QUALCOMM Incorporated, San Diego, CA (US)

(72) Inventors: Lizabeth Ann Keser, San Diego, CA (US); David Fraser Rae, San Diego, CA (US); Piyush Gupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/811,261

(22) Filed: Jul. 28, 2015

(65) Prior Publication Data

US 2016/0372446 A1    Dec. 22, 2016

Related U.S. Application Data

(60) Provisional application No. 62/181,439, filed on Jun. 18, 2015.

(51) Int. Cl.
*H01L 25/065* (2006.01)
*H01L 25/00* (2006.01)
(Continued)

(52) U.S. Cl.
CPC .... *H01L 25/0657* (2013.01); *H01L 21/31116* (2013.01); *H01L 21/563* (2013.01);
(Continued)

(58) Field of Classification Search
CPC ......... H01L 23/52; H01L 23/48; H01L 29/40; H01L 21/561; H01L 24/73;
(Continued)

(56) References Cited

U.S. PATENT DOCUMENTS

| 6,476,506 B1 | 11/2002 | O'Connor et al. |
| 7,145,225 B2 | 12/2006 | Lee |

(Continued)

FOREIGN PATENT DOCUMENTS

| JP | 2012015554 A | 1/2012 | |
| KR | 20130007022 A * | 1/2013 | ............. H05K 3/244 |

OTHER PUBLICATIONS

International Search Report and Written Opinion—PCT/US2016/037931—ISA/EPO—Sep. 26, 2016.

*Primary Examiner* — Alexander Oscar Williams
(74) *Attorney, Agent, or Firm* — Loza & Loza, LLP/Qualcomm

(57) ABSTRACT

An integrated circuit (IC) package that includes a first die, a wire bond coupled to the first die, a first encapsulation layer that at least partially encapsulates the first die and the wire bond, a second die, a redistribution portion coupled to the second die, and a second encapsulation layer that at least partially encapsulates the second die. In some implementations, the wire bond is coupled to the redistribution portion. In some implementations, the integrated circuit (IC) package further includes a package interconnect that is at least partially encapsulated by the second encapsulation layer. In some implementations, the integrated circuit (IC) package further includes a via that is at least partially encapsulated by the second encapsulation layer. In some implementations, the integrated circuit (IC) package has a height of about 500 microns (μm) or less.

30 Claims, 22 Drawing Sheets

(51) Int. Cl.
| | |
|---|---|
| H01L 25/18 | (2006.01) |
| H01L 23/31 | (2006.01) |
| H01L 21/311 | (2006.01) |
| H01L 21/768 | (2006.01) |
| H01L 23/522 | (2006.01) |
| H01L 23/528 | (2006.01) |
| H01L 23/00 | (2006.01) |
| H01L 21/56 | (2006.01) |

(52) U.S. Cl.
CPC .... *H01L 21/76802* (2013.01); *H01L 23/3135* (2013.01); *H01L 23/3157* (2013.01); *H01L 23/528* (2013.01); *H01L 23/5226* (2013.01); *H01L 24/03* (2013.01); *H01L 24/09* (2013.01); *H01L 24/19* (2013.01); *H01L 24/20* (2013.01); *H01L 24/43* (2013.01); *H01L 24/49* (2013.01); *H01L 24/85* (2013.01); *H01L 24/89* (2013.01); *H01L 24/96* (2013.01); *H01L 25/18* (2013.01); *H01L 25/50* (2013.01); *H01L 21/568* (2013.01); *H01L 2224/02371* (2013.01); *H01L 2224/02372* (2013.01); *H01L 2224/02373* (2013.01); *H01L 2224/02381* (2013.01); *H01L 2224/04105* (2013.01); *H01L 2224/08245* (2013.01); *H01L 2224/12105* (2013.01); *H01L 2224/32145* (2013.01); *H01L 2224/32225* (2013.01); *H01L 2224/48091* (2013.01); *H01L 2224/48105* (2013.01); *H01L 2224/48227* (2013.01); *H01L 2224/48228* (2013.01); *H01L 2224/48235* (2013.01); *H01L 2224/49107* (2013.01); *H01L 2224/49109* (2013.01); *H01L 2224/49431* (2013.01); *H01L 2224/49433* (2013.01); *H01L 2224/73265* (2013.01); *H01L 2224/8538* (2013.01); *H01L 2224/92247* (2013.01); *H01L 2225/0651* (2013.01); *H01L 2225/06524* (2013.01); *H01L 2225/06548* (2013.01); *H01L 2225/06568* (2013.01); *H01L 2225/06579* (2013.01); *H01L 2924/12* (2013.01); *H01L 2924/1304* (2013.01); *H01L 2924/1431* (2013.01); *H01L 2924/1434* (2013.01); *H01L 2924/151* (2013.01); *H01L 2924/15192* (2013.01); *H01L 2924/15311* (2013.01); *H01L 2924/181* (2013.01); *H01L 2924/182* (2013.01); *H01L 2924/3025* (2013.01)

(58) Field of Classification Search
CPC ... H01L 25/0657; H01L 25/105; H01L 25/50; H01L 23/3128; H01L 25/065; H01L 25/00; H01L 25/18; H01L 23/31; H01L 21/311; H01L 21/768; H01L 23/522; H01L 23/528; H01L 23/00; H01L 21/56; H01L 49/40; H01L 21/563; H01L 24/03; H01L 24/43; H01L 24/85; H01L 21/3116; H01L 21/76802; H01L 24/89; H01L 23/5226; H01L 24/09; H01L 23/3157
USPC ....... 257/777, 784, 786, 778, 734, 737, 738, 257/686, 685, 728, 723
See application file for complete search history.

(56) References Cited

U.S. PATENT DOCUMENTS

| | | | |
|---|---|---|---|
| 8,238,113 B2 | 8/2012 | Iihola et al. | |
| 8,314,480 B2 | 11/2012 | Galera et al. | |
| 8,373,268 B2 | 2/2013 | Upadhyayula et al. | |
| 8,729,714 B1 | 5/2014 | Meyer | |
| 9,035,461 B2* | 5/2015 | Hu | H01L 24/19 257/696 |
| 9,153,476 B2 | 10/2015 | Chi et al. | |
| 9,601,472 B2* | 3/2017 | Keser | H01L 25/105 |
| 9,607,967 B1* | 3/2017 | Shih | H01L 25/0657 |
| 2004/0145044 A1* | 7/2004 | Sugaya | H01L 21/56 257/698 |
| 2007/0045862 A1* | 3/2007 | Corisis | H01L 21/561 257/777 |
| 2007/0262436 A1* | 11/2007 | Kweon | H01L 21/561 257/686 |
| 2009/0085220 A1 | 4/2009 | Bernhardt et al. | |
| 2009/0127686 A1 | 5/2009 | Yang et al. | |
| 2011/0133324 A1* | 6/2011 | Fan | H01L 23/525 257/686 |
| 2011/0241192 A1* | 10/2011 | Ding | H01L 21/6835 257/686 |
| 2012/0074586 A1 | 3/2012 | Seo et al. | |
| 2012/0091597 A1* | 4/2012 | Kwon | H01L 23/48 257/777 |
| 2013/0200528 A1* | 8/2013 | Lin | H01L 24/97 257/774 |
| 2013/0270685 A1 | 10/2013 | Yim et al. | |
| 2014/0035153 A1* | 2/2014 | Mohammed | H01L 23/49811 257/774 |
| 2014/0183731 A1* | 7/2014 | Lin | H01L 23/49816 257/738 |
| 2014/0264808 A1* | 9/2014 | Wolter | H01L 25/0657 257/678 |
| 2014/0264946 A1* | 9/2014 | Kim | H01L 25/0657 257/777 |
| 2014/0312478 A1* | 10/2014 | Lin | H01L 23/4952 257/667 |
| 2014/0361387 A1* | 12/2014 | Meyer | H01L 24/19 257/415 |
| 2015/0123290 A1 | 5/2015 | Kim et al. | |
| 2015/0130070 A1* | 5/2015 | Lin | H01L 23/481 257/774 |
| 2015/0137279 A1 | 5/2015 | Tiu et al. | |
| 2015/0140736 A1 | 5/2015 | Pendse | |
| 2016/0141227 A1* | 5/2016 | Lin | H01L 23/481 257/774 |
| 2016/0148857 A1* | 5/2016 | Lin | H01L 23/481 257/762 |
| 2016/0181231 A1* | 6/2016 | Lin | H01L 21/565 257/686 |
| 2016/0190098 A1* | 6/2016 | Chen | H01L 23/3128 257/774 |
| 2016/0218049 A1* | 7/2016 | Lin | H01L 23/481 |
| 2016/0315072 A1* | 10/2016 | Keser | H01L 23/13 |

* cited by examiner

LOW PROFILE INTEGRATED CIRCUIT (IC) PACKAGE COMPRISING A PLURALITY OF DIES

CLAIM OF PRIORITY/CLAIM OF BENEFIT

The present application claims priority to U.S. Provisional Application No. 62/181,439 titled "Low Profile Package Comprising Multiple Dies", filed Jun. 18, 2015, which is hereby expressly incorporated by reference herein.

BACKGROUND

Field of the Disclosure

Various features relate generally to an integrated circuit (IC) package, and more specifically to an IC package that includes a plurality of dies.

Background

FIG. 1 illustrates a package on package (PoP) device 100 that includes a first package 102 and a second package 104. The first package 102 includes a first die 120, and a first package substrate 122. The first package substrate 122 includes a first plurality of pads 124 and a first pad 126. The first die 120 is coupled to the first package substrate 122 through a first plurality of solder balls 128. Specifically, the first die 120 is coupled to the first plurality of pads 124 through the first plurality of solder balls 128. A second plurality of solder balls 130 is coupled to the first package substrate 122.

The second package 104 includes a second die 140, a second package substrate 142, a second pad 146, a wire bond 148, and an encapsulation layer 160. The second die 140 is coupled to the second package substrate 142. The wire bond 148 is coupled to the second die 140 and a pad of the second package substrate 142. The second package substrate 142 is needed in order to provide structural support for the second package 104, as well as providing a base for the second die 140.

The second package 104 is coupled to the first package 102 through a third solder ball 156. For example, the third solder ball 156 is coupled to the first pad 126 of the first package substrate 122, and the second pad 146 of the second package 104.

The height (e.g., Z-height) of the package on package (PoP) device 100 is about 1000 microns (μm) or greater. That is, the height between the top of the package on package (PoP) device 100 (e.g., top of the encapsulation layer 160) and the bottom of the package on package (PoP) device 100 (e.g., bottom of the second plurality of solder balls 130) is about 1000 microns (μm) or greater.

There is an ongoing industry trend to reduce the height of packages, as these packages are placed in smaller and smaller devices. Ideally, such a package will have a better form factor, be cheaper to fabricate, while at the same time meeting the needs and/or requirements of mobile and/or wearable devices.

SUMMARY

Various features relate to a low profile integrated circuit (IC) package that includes a plurality of dies. Various features also relate to a low profile integrated circuit (IC) package that bypasses the use of a package substrate between dies to lower the height profile of the integrated circuit (IC) package that includes a plurality of dies One example provides an integrated circuit (IC) package that includes a first die, a wire bond coupled to the first die, a first encapsulation layer that at least partially encapsulates the first die and the wire bond, a second die, a redistribution portion coupled to the second die, and a second encapsulation layer that at least partially encapsulates the second die.

Another example provides an integrated circuit (IC) package that includes a first die, a wire bond coupled to the first die a first encapsulation layer that at least partially encapsulates the first die and the wire bond, a second die, means for interconnecting package portions coupled to the wire bond, a redistribution portion coupled to the second die and the means for interconnecting package portions, and a second encapsulation layer that at least partially encapsulates the second die and the means for interconnecting package portions.

Another example provides a method for fabricating an integrated circuit (IC) package. The method provides a second die. The method forms a second encapsulation layer that at least partially encapsulates the second die. The method forms a redistribution portion over the second die and over the second encapsulation layer. The method provides a first die. The method forms a wire bond and couples the wire bond to the first die. The method forms a first encapsulation layer that at least partially encapsulates the first die and the wire bond.

DRAWINGS

Various features, nature and advantages may become apparent from the detailed description set forth below when taken in conjunction with the drawings in which like reference characters identify correspondingly throughout.

DETAILED DESCRIPTION

Figure 1:
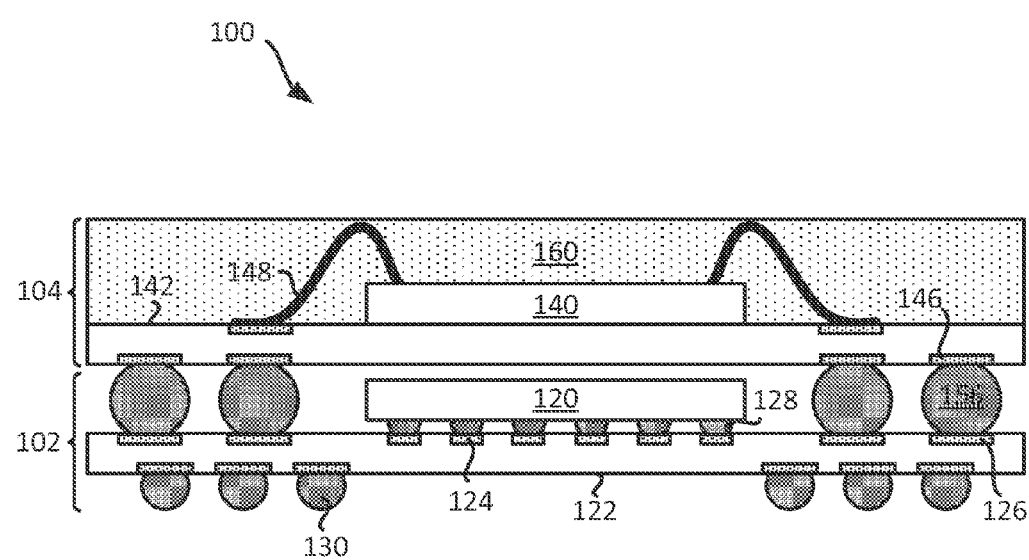
FIG. 1 illustrates a cross-sectional view of a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a device package (e.g., an integrated circuit (IC) package) that includes a first die, a wire bond coupled to the first die, a first encapsulation layer that at least partially encapsulates the first die and the wire bond, a second die, a redistribution portion coupled to the second die, and a second encapsulation layer that at least partially encapsulates the second die. In some implementations, the wire bond is coupled to the redistribution portion. In some implementations, the device package further includes a package interconnect that is at least partially encapsulated by the second encapsulation layer. In some implementations, the package interconnect includes a dielectric layer, a first via traversing the dielectric layer, a first pad coupled to the first via, and a second pad coupled to the first via. In some implementations, the device package further includes a via that is at least partially encapsulated by the second encapsulation layer. In some implementations, the device package has a height of about 500 microns (μm) or less.

In some implementations, the height of the device package may be defined along the Z-direction of the device package, which is shown in the figures of the present disclosure. In some implementations, the Z-direction of the device package may be defined along an axis between a top portion and a bottom portion of the device package. The terms top and bottom may be arbitrarily assigned, however as an example, the top portion of the device package may be a portion comprising an encapsulation layer, while a bottom portion of the device package may be a portion comprising a redistribution portion or a plurality of solder balls. In some implementations, the top portion of the device package may be a back side of the device package, and the bottom portion of the device package may be a front side of the device package. The front side of the device package may be an active side of the device package. A top portion may be a higher portion relative to a lower portion. A bottom portion may be a lower portion relative to a higher portion. Further examples of top portions and bottom portions will be further described below. The X-Y directions of the device package may refer to the lateral direction and/or footprint of the device package. Examples of X-Y directions are shown in the figures of the present disclosure and/or further described below. In many of the figures of the present disclosure, the device packages and their respective components are shown across a X-Z cross-section or X-Z plane. However, in some implementations, the device packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may provide an electrical path for a signal (e.g., data signal, ground signal, power signal) An interconnect may be part of a circuit. An interconnect may include more than one element or component.

Exemplary Low Profile Package Comprising a Plurality of Dies

Figure 2:
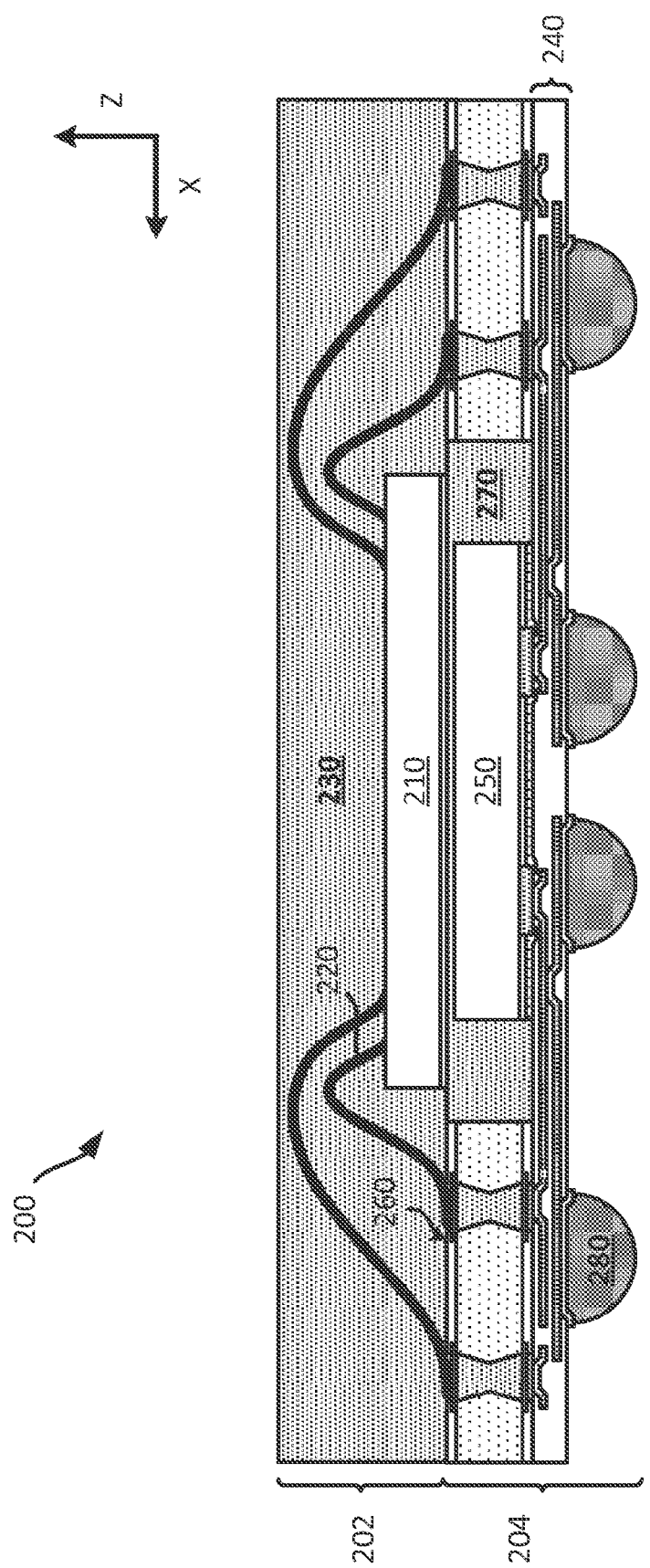
FIG. 2 illustrates a cross-sectional view of an example of a low profile package comprising a plurality of dies.

FIG. 2 illustrates a device package 200 that includes a plurality of dies. The device package 200 may be an integrated circuit (IC) package. The device package 200 has a height (e.g., Z-height) that is less than a comparable package on package (PoP) device (e.g., package on package (PoP) device 100). In some implementations, the height of the device package 200 is about 500 microns (μm) or less. In contrast, the height of a comparable package on package (PoP) device is about 1000 microns (μm) or greater. The term comparable package on package (PoP) device means a device that has a comparable or similar footprint or surface area as another device package (e.g., device package 200). Thus, the device package 200 of FIG. 2 provides a package that has a lower height profile than current package on package (PoP) devices.

The device package 200 (e.g., integrated circuit package) includes a first package portion 202 and a second package portion 204. The first package portion 202 is coupled to the second package portion 204 through at least one package interconnect 260 and at least one wire bond 220.

The package interconnect 260 may be a structure that includes one or more components and/or one or more materials, and is configured to provide at least one electrical path between different portions of the device package 200. The package interconnect 260 may be a means for interconnecting package portions. Different implementations may use a package interconnect (e.g., package interconnect 260) with different designs and configurations. In some implementations, the package interconnect or means for interconnecting package portions may be a package interconnect from a group of package interconnects comprising a printed circuit board (PCB) bar, a preformed through substrate via (TSV) bar, and/or an in-situ plated metal interconnect (e.g., in-situ plated copper interconnect). In some implementations, the selection of a particular package interconnect may depend on cost, design rule requirements, and overall height. For example, a plated metal interconnect or TSV bar may have finer design rules and a lower profile, but would be more expensive than a larger and thicker PCB bar. In some implementations, the package interconnect or means for interconnecting package portions may be a via. The package interconnect 260 will be described in further detail below in FIG. 3.

The first package portion 202 includes a first die 210, a wire bond 220 (e.g., at least one wire bond), and a first encapsulation layer 230. The first die 210 (e.g., a die) may be an integrated circuit (IC) that includes a plurality of transistors and/or other electronic components. The first die 210 may be a logic die and/or a memory die. The first die 210 is coupled to the wire bond 220. The first encapsulation layer 230 encapsulates (e.g., at least partially encapsulates) the first die 210 and the wire bond 220. The first package portion 202 can include one or more dies, electronic and/or metallic shielding components stacked next to or on top of the first die 210. These dies, electronic and/or metallic shielding components may be coupled to the second package portion 204 and/or the first die 210 by wire bond and/or other circuitry.

The second package portion 204 includes a redistribution portion 240, a second die 250, the package interconnect 260, a second encapsulation layer 270, and a solder ball 280. The second package portion 204 may be a fan out wafer level package (FOWLP). The second die 250 may be a logic die and/or a memory die. The second die 250 is coupled to the redistribution portion 240. The package interconnect 260 is coupled to the redistribution portion 240. The redistribution portion 240 may be a fan out portion (e.g. for fanning or routing of signaling to and from devices with different 110/O pitches). The second encapsulation layer 270 at least partially encapsulates the second die 250. The second encapsulation layer 270 may also at least partially encapsulate the package interconnect 260.

In some implementations, the first die 210 is electrically coupled to the second die 250 through the wire bond 220, the package interconnect 260 and the redistribution portion 240. Thus, in some implementations, the wire bond 220, the package interconnect 260 and the redistribution portion 240 provide at least one electrical path between the first die 210 and the second die 250. In some implementations, the device package 200 may include a circuit that includes the first die 210, the second die 250, the package interconnect 260 and the redistribution portion 240.

As shown in FIG. 2, the first package portion 202 is coupled to the package interconnect 260 of the second package portion 204 through the wire bond 220. As will be further described below in at least FIG. 3, the package interconnect 260 includes a first pad 310 that is coupled to the wire bond 220.

As mentioned above, the device package 200 has a height of about 500 microns (μm) or less. In some implementations, this is achieved by the absence of a package substrate in the first package portion 202. In comparison, in FIG. 1, the second package 104, which includes the second package substrate 142 and the third solder ball 156 (which is between the first package substrate 122 and the second package substrate 142), causes the package on package (PoP) device 100 to be much thicker than the device package 200. In FIG. 1, the second package substrate 142 is needed to provide structural support and a base for the second die 140. In contrast, the device package 200 does not need a similar package substrate since the second encapsulation layer 270 provides at least some of the structural support and/or a base for the first die 210, therefore bypassing the need for a package substrate in the device package 200, while still providing a robust and reliable low profile device package 200.

In some implementations, the first die 210 has a height of about 50 microns (μm) or less. In some implementations, the second die 250 has a height of about 150 microns (μm) or less. In some implementations, the package interconnect 260 has a height of about 150 microns (μm). However, the package interconnect 260 may have a height that is greater or less than 150 microns (μm). In some implementations, the redistribution portion 240 has a height of about 40 microns (μm) or less. The device package 200 may have an X-Y dimension (e.g., lateral area and/or footprint) of about 5 mm×5 mm to 20 mm×20 mm (millimeter). The pitch of interconnects in the package interconnect 260 may be about 200 microns (μm) or less, where a pitch is a center to center distance between two adjacent interconnects (e.g., two adjacent pads). For example, the package interconnect 260 may include two adjacent vias. In some implementations, the pitch of the two adjacent vias in the package interconnect 260 may be about 200 microns (μm) or less. It is noted that the above exemplary dimensions may also be applicable to other device packages described in the present disclosure.

Figure 3:
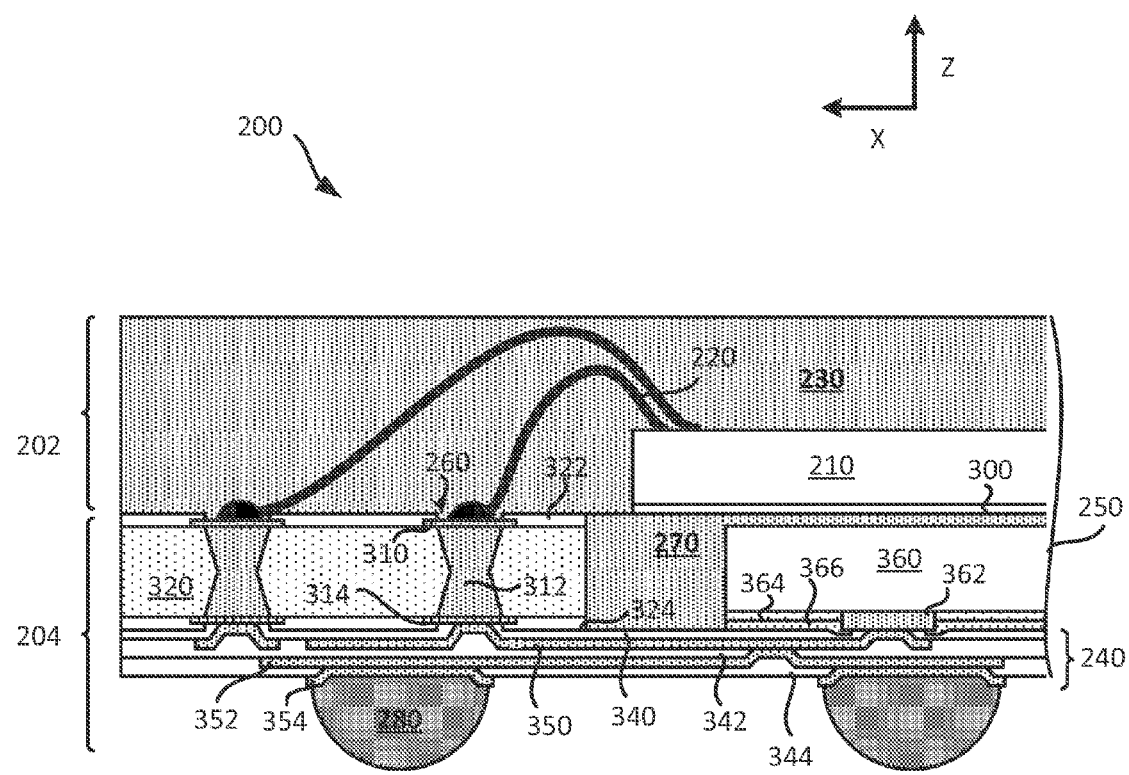
FIG. 3 illustrates a close up cross-sectional view of part of a low profile package comprising a plurality of dies.

FIG. 2 illustrates a high level illustration of a device package 200 that includes a plurality of dies. FIG. 3 illustrates a close up view of the device package 200 of FIG. 2. As shown in FIG. 3, the device package 200 includes the first package portion 202 and the second package portion 204. The first package portion 202 is coupled (e.g., electrically coupled) to the second package portion 204 through the wire bond 220 and the package interconnect 260.

FIG. 3 illustrates that the package interconnect 260 includes a dielectric layer 320, a first solder resist layer 322, a second solder resist layer 324, a first pad 310, a first via 312, and a second pad 314. The first solder resist layer 322 and the second solder resist layer 324 are optional. The first via 312 is coupled to the first pad 310. The second pad 314 is coupled to the first via 312. The first via 312 may traverse the dielectric layer 320. The dielectric layer 320 at least partially encapsulates the first via 312. As shown in FIG. 3, the package interconnect 260 may include a plurality of vias and a plurality of pads. In some implementations, the dielectric layer 320 is an encapsulation layer that is similar or identical to the second encapsulation layer 270.

FIG. 3 illustrates that a surface (e.g., top surface) of the package interconnect 260 is substantially co-planar to a surface (e.g., top surface) of the second encapsulation layer 270. The top surface of the package interconnect 260 may be a surface (e.g., top surface) of the dielectric layer 320, a surface (e.g., top surface) of the first pad 310, or a surface (e.g., top surface) of the first solder resist layer 322. However, it is noted that the top surface of the package interconnect 260 does not need to be substantially co-planar to the top surface of the second encapsulation layer 270. In some implementations, the top surface of the package interconnect 260 may be substantially co-planar to the top surface of the second die 250 (e.g., back side of the die). In some implementations, substantially co-planar surfaces are defined as surfaces that are within a height of about 5 microns (μm) or less, of each other.

FIG. 3 illustrates that the first die 210 includes a first portion that vertically overlaps with the second die 250, and a second portion that is vertically non-overlapping with the second die 250 and supported by the second encapsulation layer 270. The second portion of the first die 210 does not vertically overlap with the second die 250. In FIG. 3, the first portion and the second portion of the first die 210 are supported by the second encapsulation layer 270. In some implementations, portions of the first die 210 may be supported by the second die 250. For example, as shown and described in FIG. 8, the first portion of the first die 210 that vertically overlaps with the second die 250 is supported by the second die 250. In FIG. 3, it is noted that the first die 210 has a greater footprint (e.g., greater X-Y area) than the second die 250. However, the first die 210 may have a different footprint (e.g., may have a smaller X-Y area than the second die 250). In addition, the first die 210 may be arranged with a different offset from the second die 250.

In some implementations, the redistribution portion 240 may include at least one dielectric layer, and at least one redistribution layer. In some implementations, the redistribution portion 240 may also include at least one under bump metallization (UBM) layer.

As shown in FIG. 3, the redistribution portion 240 includes a first dielectric layer 340, a second dielectric layer 342, a third dielectric layer 344, a first redistribution layer 350, a second redistribution layer 352, and/or an under bump metallization (UBM) layer 354. The first redistribution layer 350 is coupled to the package interconnect 260 and the second die 250. More specifically, the first redistribution layer 350 is coupled to the second pad 314 of the package interconnect 260. The second redistribution layer 352 is coupled to the first redistribution layer 350. The UBM layer 354 is coupled to the second redistribution layer 352. The solder ball 280 is coupled to the UBM layer 354. In some implementations, the UBM layer 354 may be optional. In such instances, the solder ball 280 may be directly coupled to the second redistribution layer 352. It is noted that different implementations may have a different number of redistribution layers (e.g., one or more redistribution layers).

In some implementation, a redistribution layer (e.g. 350, 352), is a component that allows or facilitates an electrical connection between various points, elements and/or components. In some implementations, a redistribution layer (e.g. 350, 352) may include a trace, a via, and/or a pad. In some implementations, a redistribution layer (e.g. 350, 352) is an electrically conductive material that may provide an electrical path for a signal (e.g., data signal, ground signal, power signal) A redistribution layer (e.g. 350, 352) may include more than one element or component. A redistribution layer (e.g. 350, 352) may redistribute signaling from I/O pads of a die to other parts of the device package.

In some implementations, the redistribution portion 240 is a part of the device package 200 that allows input/output (I/O) pads of a die (e.g., second die 250) to be available (e.g., fan out) in other locations of the device package 200. In some implementations, the first redistribution layer 350 and/or the second redistribution layer 352 redistribute the signaling from I/O pads of the second die 250 to other locations in the device package 200.

The second die 250 may include a substrate portion 360 (e.g., silicon substrate), a pad 362, a first passivation layer 364, and a second passivation layer 366. The substrate portion 360 may include lower level metal layers and lower level dielectric layers. In some implementations, the pad 362 of the second die 250 is coupled to the first redistribution layer 350 of the redistribution portion 240.

The first die 210 may be coupled to the second package portion 204 through an adhesive 300. In particular, the first die 210 may be coupled to the second encapsulation layer 270 through the adhesive 300. In some implementations, the first die 210 may be coupled to the second die 250 through the adhesive 300.

The wire bond 220 is coupled to the first die 210 and the first pad 310 of the package interconnect 260. The first pad 310 is coupled to the first via 312. The first via 312 traverses the dielectric layer 320. The first via 312 is coupled to the second pad 314. The second pad 314 is coupled to the first redistribution layer 350. The first redistribution layer 350 is coupled to the pad 362 of the second die 250. In some implementations, the first redistribution layer 350, the second redistribution layer 352, the second pad 314, the first via 312, the first pad 310, and/or the wire bond 220 provide an electrical path between the first die 210 and the second die 250. Thus, in some implementations, the first die 210 and the second die 250 may be electrically coupled through the wire bond 220, the first pad 310, the first via 312, the second pad 314, the first redistribution layer 350, and/or the second redistribution layer 352. In some implementations, the device package 200 (e.g., integrated circuit (IC) package) may include a circuit that includes the first die 210, the second die 250, the wire bond 220, the first pad 310, the first via 312, the second pad 314, the first redistribution layer 350, the second redistribution layer 352, and/or the UBM layer 354.

The first encapsulation layer 230 and the second encapsulation layer 270 may be the same material or different materials (e.g., mold, epoxy fill).

Figure 4:
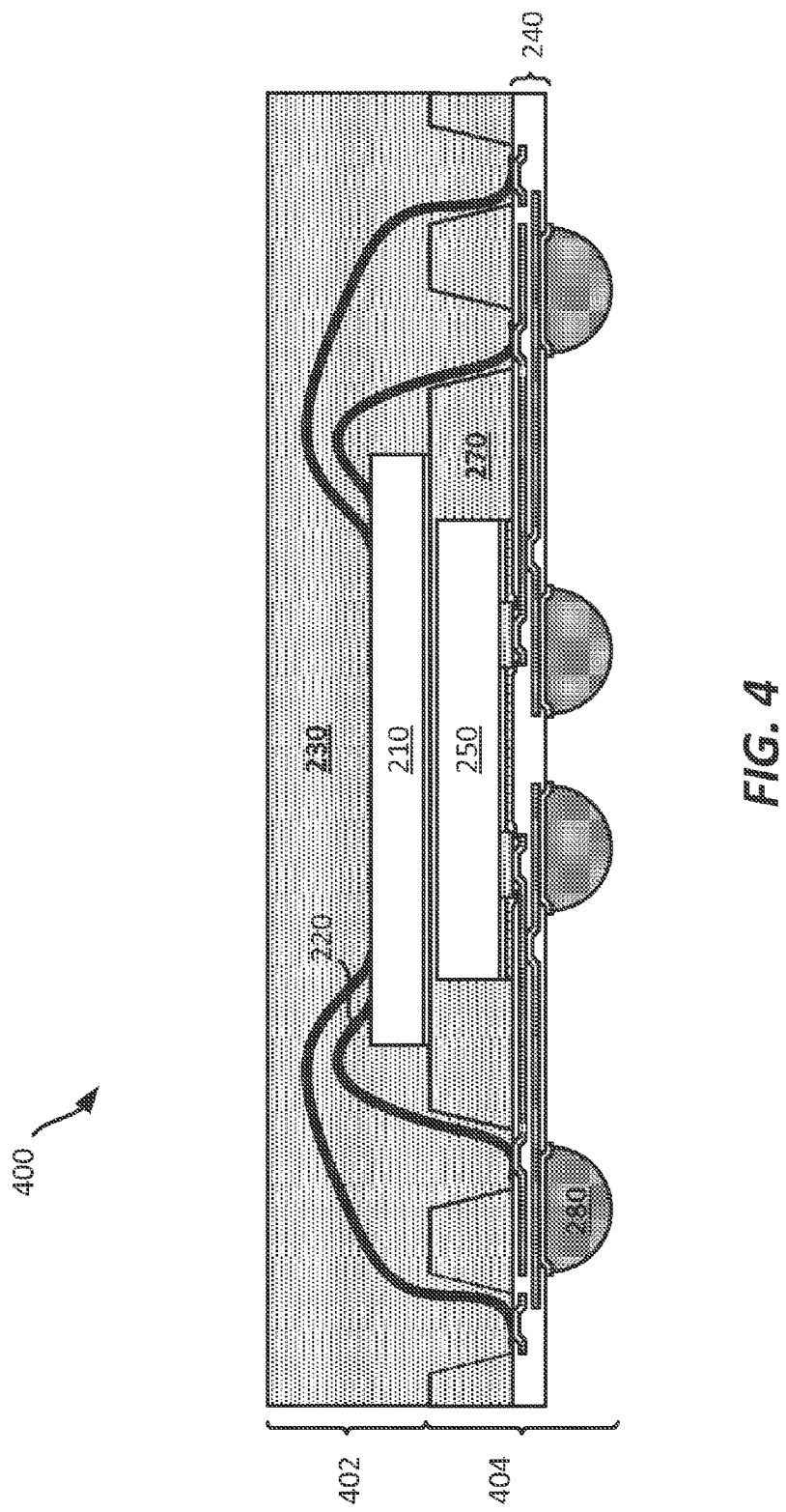
FIG. 4 illustrates a cross-sectional view of another example of a low profile package comprising a plurality of dies.
Figure 5:
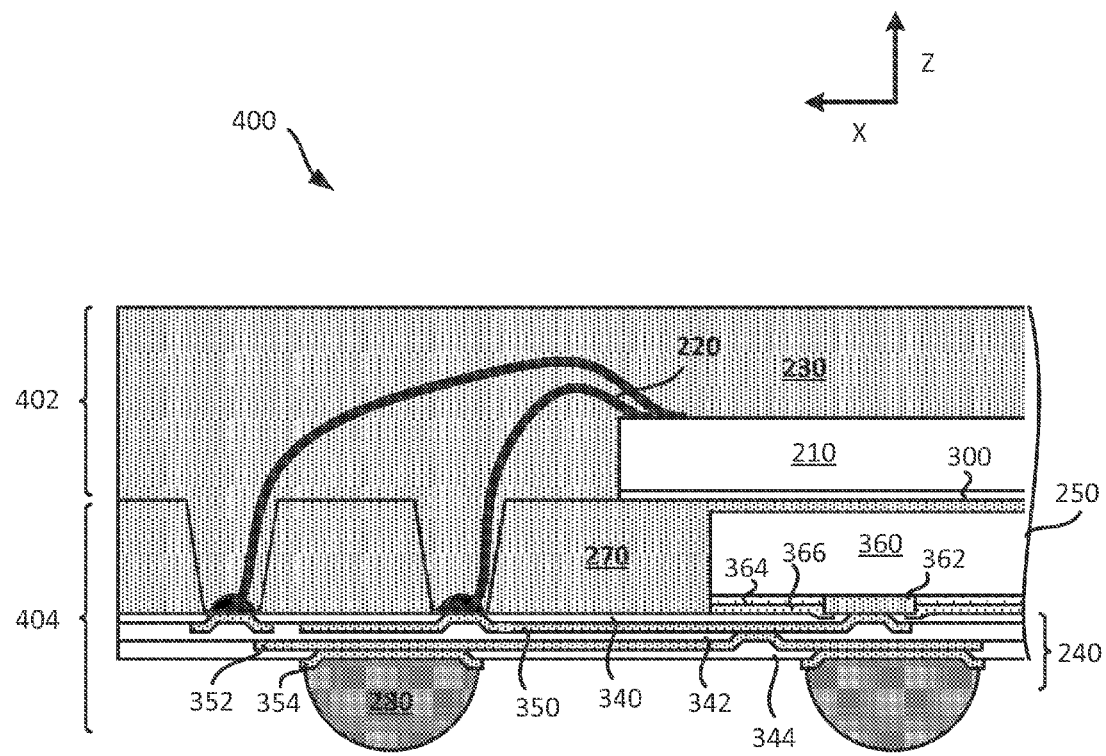
FIG. 5 illustrates a close up cross-sectional view of part of a low profile package comprising a plurality of dies.

In some implementations, the package interconnect 260 may be optional. FIGS. 4-5 below illustrate an example of a device package without the package interconnect 260, while still providing a low profile device package (e.g., integrated circuit (IC) package) that has a height that is less than comparable package on package (PoP) devices.

Exemplary Low Profile Package Comprising a Plurality of Dies

FIG. 4 illustrates a device package 400 that includes a plurality of dies. The device package 400 may be an integrated circuit (IC) package. The device package 400 has a height (e.g., Z-height) that is less than a comparable package on package (PoP) device (e.g., package on package (PoP) device 100). In some implementations, the height of the device package 400 is about 500 microns (μm) or less. In contrast, the height of a comparable package on package (PoP) device is about 1000 microns (μm) or greater. Thus, the device package 400 of FIG. 4 provides a package that has a lower height profile than current package on package (PoP) devices.

The device package 400 of FIG. 4 is similar to the device package 200 of FIG. 2, except that the device package 400 does not include the package interconnect 260 shown in FIG. 2. In some implementations, the device package 400 may be cheaper to fabricate than the device package 200 of FIG. 2, while still providing a robust and reliable low profile device package (e.g., integrated circuit (IC) package).

The device package 400 includes a first package portion 402 and a second package portion 404. The first package portion 402 is coupled to the second package portion 404 through at least one wire bond 220.

As shown in FIG. 4, the first package portion 402 includes the first die 210, the wire bond 220 (e.g., at least one wire bond), and the first encapsulation layer 230. The first die 210 is coupled to the wire bond 220. The first encapsulation layer 230 encapsulates (e.g., at least partially encapsulates) the first die 210 and the wire bond 220.

The second package portion 404 includes the redistribution portion 240, the second die 250, the second encapsulation layer 270, and the solder ball 280. The second package portion 404 may be a fan out wafer level package (FOWLP). The second die 250 is coupled to the redistribution portion 240. The redistribution portion 240 may be a fan out portion. The second encapsulation layer 270 at least partially encapsulates the second die 250.

As shown in FIG. 4, the first package portion 402 is coupled to the redistribution portion 240 of the second package portion 404 through the wire bond 220, which is further described below in at least FIG. 5. The wire bond 220 traverses through a cavity in the second encapsulation layer 270 to couple to the redistribution portion 240. The cavity in the second encapsulation layer 270 that includes the wire bond 220 may be filled with the first encapsulation layer 230. As mentioned previously, the wire bond 220 may also be encapsulated with the first encapsulation layer 230.

In some implementations, the first die 210 is electrically coupled to the second die 250 through the wire bond 220 and the redistribution portion 240. Thus, in some implementations, the wire bond 220 and the redistribution portion 240 may provide at least one electrical path between the first die 210 and the second die 250. In some implementations, the device package 400 (e.g., integrated circuit (IC) package)

includes a circuit that includes the first die 210, the second die 250, the wire bond 220 and the redistribution portion 240.

The first encapsulation layer 230 and the second encapsulation layer 270 may be the same material or different materials (e.g., mold, epoxy fill). In some implementations, the first encapsulation layer 230 and/or the second encapsulation layer 270 may be a litho-patternable layer. A litho-patternable layer/material is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

FIG. 4 illustrates a high level illustration of a device package 400 that includes a plurality of dies. FIG. 5 illustrates a close up view of the device package 400 of FIG. 4. As shown in FIG. 5, the device package 400 (e.g., integrated circuit (IC) package) includes the first package portion 402 and the second package portion 404. The first package portion 402 is coupled to the second package portion 404 through the wire bond 220.

As shown in FIG. 5, the second encapsulation layer 270 includes a cavity that allows the wire bond 220 to couple to the redistribution portion 240. More specifically, the wire bond 220 is coupled to the first redistribution layer 350 of the redistribution portion 240. The first redistribution layer 350 may define one or more trace, via or pad as examples, in the redistribution portion 240. The cavity where the wire bond 220 is placed is filled with the first encapsulation layer 230, which also encapsulates the wire bond 220.

In some implementations, the first redistribution layer 350 and the wire bond 220 provide at least one electrical path between the first die 210 and the second die 250. Thus, in some implementations, the first die 210 and the second die 250 may be electrically coupled through the wire bond 220, the first redistribution layer 350, and/or the second redistribution layer 352. In some implementations, the device package 400 (e.g., integrated circuit (IC) package) may include a circuit that includes the first die 210, the second die 250, the wire bond 220, the first redistribution layer 350, and/or the second redistribution layer 352.

Exemplary Sequence for Fabricating a Package Comprising a Plurality of Dies

In some implementations, providing/fabricating a low profile device package that includes a plurality of dies includes several processes. FIG. 6 (which includes FIGS. 6A-6D) illustrates an exemplary sequence for providing/fabricating a low profile device package that includes a plurality of dies. In some implementations, the sequence of FIGS. 6A-6D may be used to provide/fabricate the device package (e.g., integrated circuit (IC) package) that includes a plurality of dies of FIGS. 2-3 and/or other device packages described in the present disclosure. However, for the purpose of simplification, FIGS. 6A-6D will be described in the context of providing/fabricating the device package of FIG. 3.

It should be noted that the sequence of FIGS. 6A-6D may combine one or more stages in order to simplify and/or clarify the sequence for providing a device package. In some implementations, the order of the processes may be changed or modified.

Figure 6A:
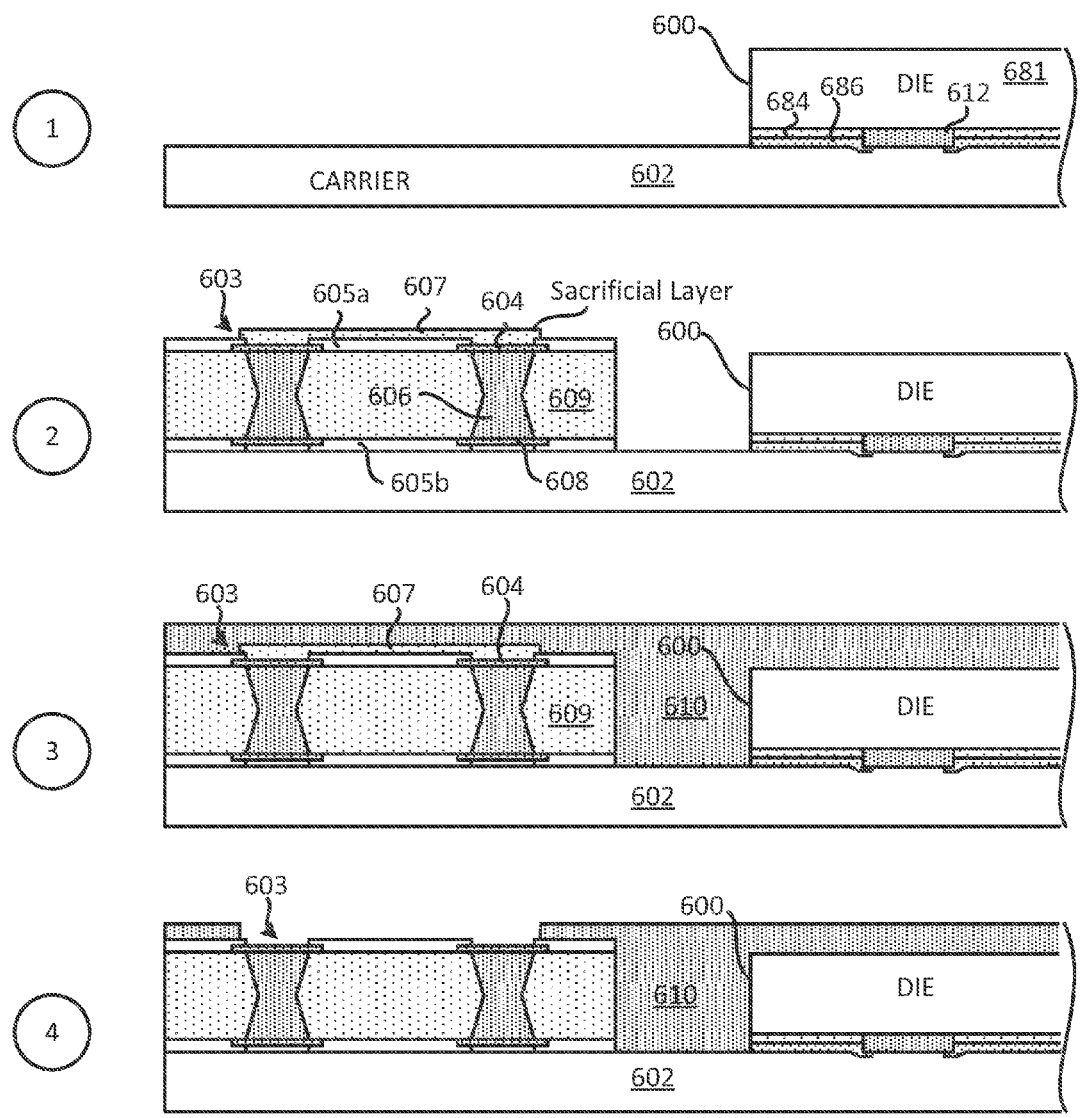
FIG. 6 (which comprises FIGS. 6A-6D) illustrates an example of a sequence for fabricating a low profile package comprising a plurality of dies.

Stage 1, as shown in FIG. 6A, illustrates a state after a second die 600 is coupled (e.g., placed) to a carrier 602. The second die 600 may be identical and/or similar to the second die 250 of FIG. 3. The second die 600 may be a logic die and/or a memory die. The second die 600 may include a substrate portion 681 (e.g., silicon substrate), a third pad 612, a first passivation layer 684, and a second passivation layer 686. The substrate portion 681 may include lower level metal layers and lower level dielectric layers.

Stage 2 illustrates a state after a package interconnect 603 is coupled (e.g., placed) to the carrier 602. The package interconnect 603 may be identical and/or similar to the package interconnect 260 of FIG. 3. The package interconnect 603 includes a first pad 604, a first via 606, a second pad 608, and a dielectric layer 609. The package interconnect 603 may also optionally include solder resist layers 605 (e.g., solder resist layer 605a, solder resist layer 605b). The package interconnect 603 may also optionally include a sacrificial layer 607. The sacrificial layer 607 may a dielectric or a metal. Examples of a dielectric sacrificial layer include a photo-sensitive polymer, a dissolvable polymer, a high temp wax, and a thermally sensitive polymer. Examples of a metal sacrificial layer include nickel (Ni).

Stage 3 illustrates a state after a second encapsulation layer 610 is formed on the second die 600 and the package interconnect 603. The second encapsulation layer 610 is formed such that the second encapsulation layer 610 at least partially encapsulates the second die 600 and/or the package interconnect 603. In other implementations, the second encapsulation layer 610 at least partially encapsulates the second die 600 or the package interconnect 603. In some implementations, a portion of the package interconnect 603 or the second die 600, or both the package interconnect 603 and the second die 600, may be left exposed (e.g., not covered by the second encapsulation layer 610).

Stage 4 illustrates a state after portions of the second encapsulation layer 610 and the sacrificial layer 607 are removed. For example, portions of the second encapsulation layer 610 may be removed so as to leave exposed the top portion of the second die 600 and/or the package interconnect 603. In some implementations, the second encapsulation layer 610 may be removed through a grinding process and/or laser process. In some implementations, after the grinding process, the top surface of the second encapsulation layer 610 may be substantially co-planar with the top surface of the package interconnect 603.

In some implementations, when the sacrificial layer 607 is present, the sacrificial layer 607 may be removed (e.g., subsequently removed after portions of the second encapsulation layer 610 are removed) through a non-laser process (e.g., chemical process, thermal process, mechanical process) to expose the pads (e.g., first pad 604) of the package interconnect 603. The advantage of using a non-laser process is that it reduces and/or minimizes the damage on the pads. If a laser process were to be used to expose the pads, the laser process could damage the pads (e.g., reduce the pad thickness, cause an uneven pad surface, cause a rough pad surface), which can result in a less robust or reliable connection to the package interconnect 603.

The roughness of a surface can be expressed by the vertical deviations of the roughness profile of the surface from the mean line. For example, the roughness of a surface (e.g., surface of pad) can be expressed by the amplitude parameters and/or variations of the surface from a mean flat surface and/or a mean line of the surface. In some implementations, the arithmetic average ($R_a$) of the absolute values of the amplitude of the vertical deviation of the roughness profile of the surface (e.g., pad surface) from a mean line is one example of quantifying roughness. In some implementations, the roughness of the surface of the pad (e.g., first pad 604) protected with a sacrificial layer (e.g., the sacrificial layer 607) has a $R_a$ value (surface roughness $R_a$ value) of about 1 micron (μm) or less. In some implementations, a low $R_a$ value and/or roughness provides more robust and/or reliable connections, thereby providing more robust and/or reliable signal and/or power transmission between connections in the package.

Figure 6B:
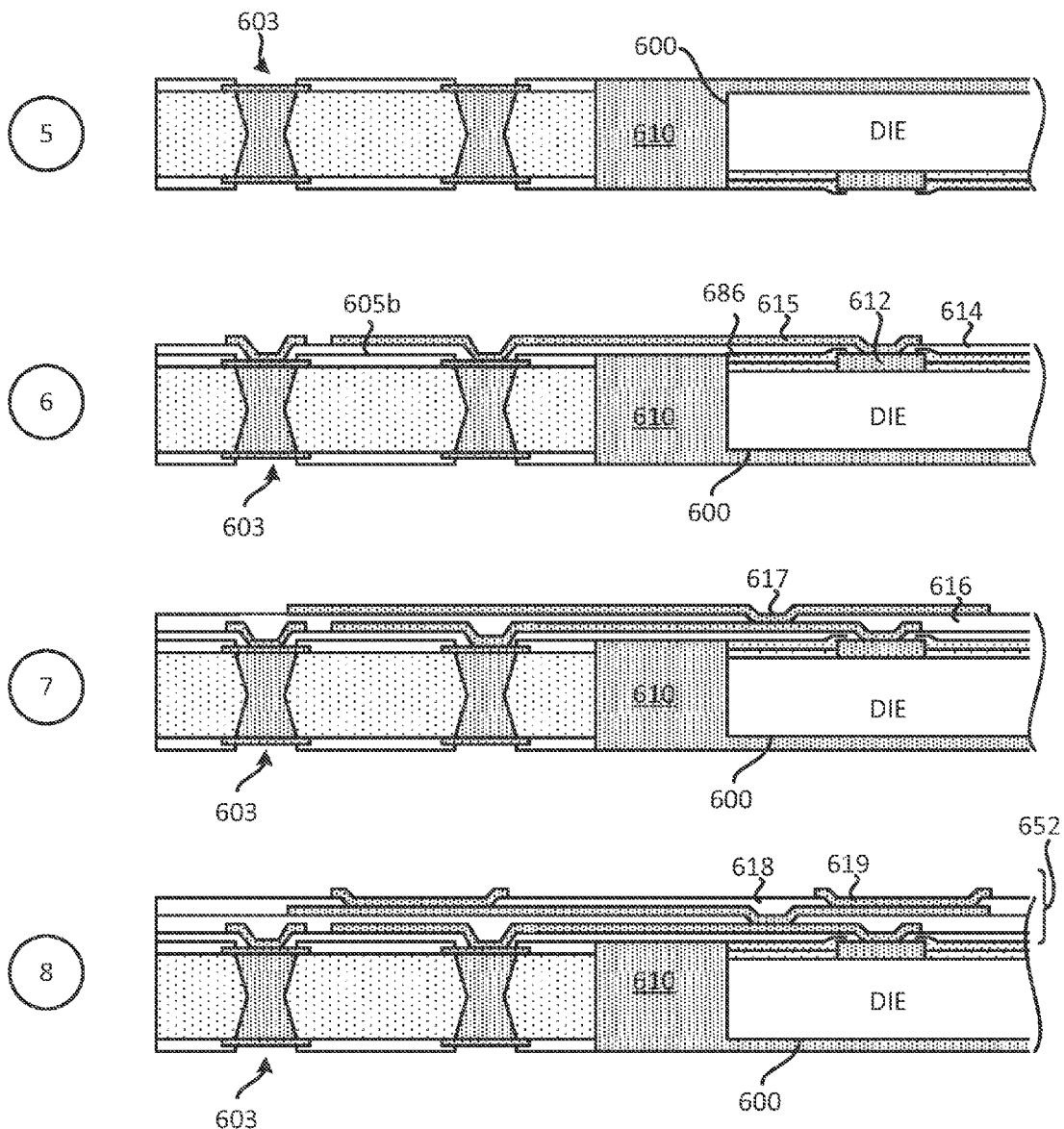

Stage 5, as shown in FIG. 6B, illustrates a state after the carrier 602 is decoupled (e.g., detached, removed) from the second die 600, the package interconnect 603, and the second encapsulation layer 610. In some implementations, stage 5 may illustrate a state after more portions of the second encapsulation layer 610 are removed. As mentioned above, in some implementations, the top surface of the second encapsulation layer 610 may be substantially coplanar with the top surface of the package interconnect 603.

Stage 6 illustrates a state after a first dielectric layer 614 and a first redistribution layer 615 are formed. The first dielectric layer 614 may be formed on the second passivation layer 686 of the second die 600 and the optional solder resist layer 605 of the package interconnect 603. The first redistribution layer 615 is formed such that the first redistribution layer 615 is coupled to the third pad 612 of the second die 600 and the package interconnect 603.

Stage 7 illustrates a state after a second dielectric layer 616 and a second redistribution layer 617 are formed. The second dielectric layer 616 may be formed on the first dielectric layer 614. The second redistribution layer 617 is formed such that the second redistribution layer 617 is coupled to the first redistribution layer 615.

Stage 8 illustrates a state after a third dielectric layer 618 and an under bump metallization (UBM) layer 619 are formed. The third dielectric layer 618 may be formed on the second dielectric layer 616. The UBM layer 619 is formed such that the UBM layer 619 is coupled to the second redistribution layer 617.

Figure 6C:
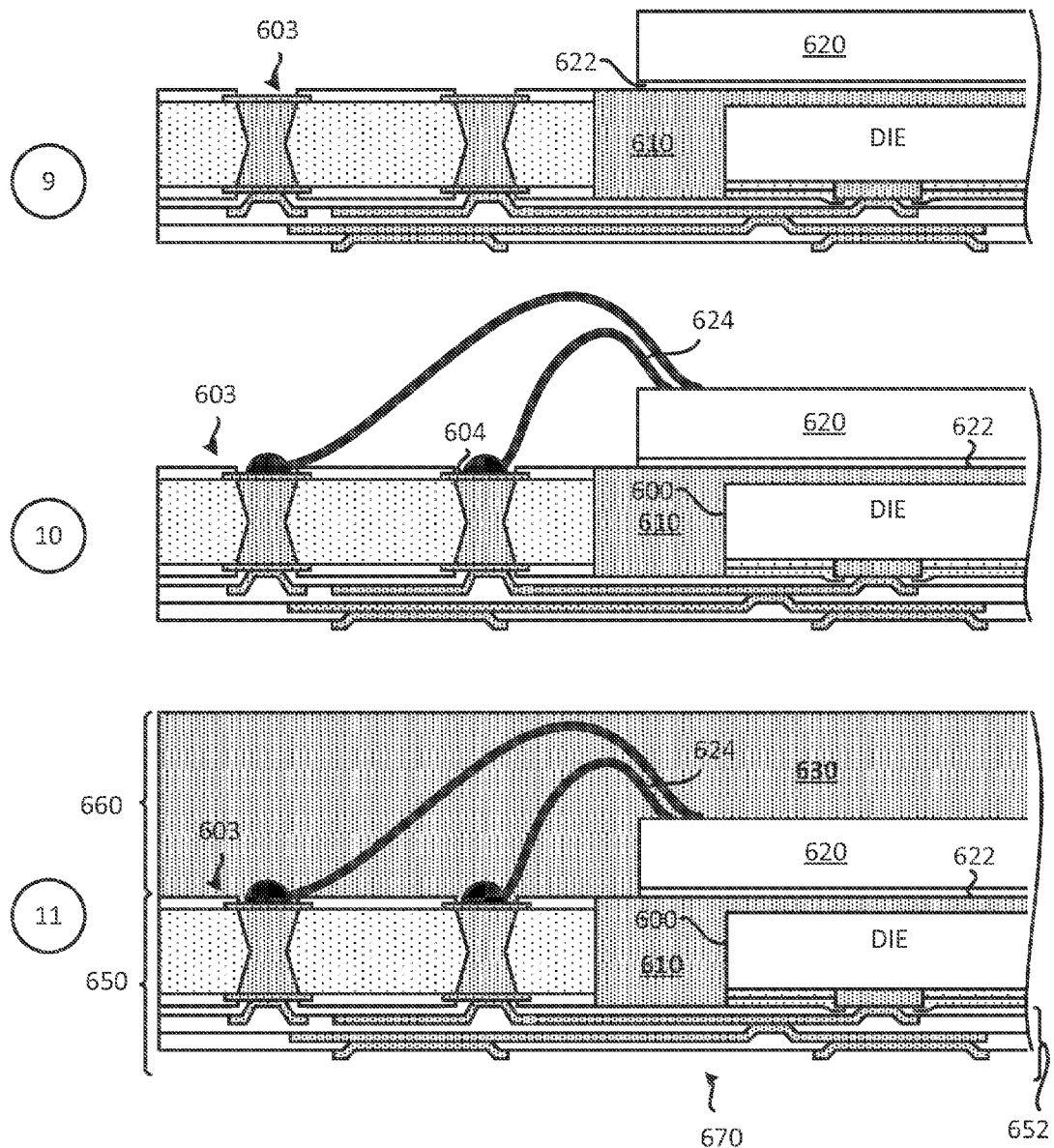

Stage 9, as shown in FIG. 6C, illustrates a state after a first die 620 is placed over the second encapsulation layer 610. The first die 620 is coupled to the second encapsulation layer 610 through an adhesive 622. In some implementations, the first die 620 may be similar to the first die 210 of FIG. 3. In some implementations, the first die 620 may be coupled to the second die 600 through the adhesive 622. In some implementations, the first die 620 may be placed over the second die 600 and the second encapsulation layer 610.

Stage 10 illustrates a state after a wire bond 624 is formed, where the wire bond 624 couples the first die 620 and the package interconnect 603. More specifically, the wire bond 624 couples the first die 620 and the first pad 604 of the package interconnect 603.

Stage 11 illustrates a state after a first encapsulation layer 630 is formed on the first die 620 and the wire bond 624. In some implementations, stage 10 may illustrate a device package 670 (e.g., integrated circuit (IC) package) that includes a first package portion 650 and a second package portion 660. The first package portion 650 may include the second die 600, the package interconnect 603, the second encapsulation layer 610, and a redistribution portion 652. The second package portion 660 may include the first die 620, the wire bond 624, and the first encapsulation layer 630.

Figure 6D:
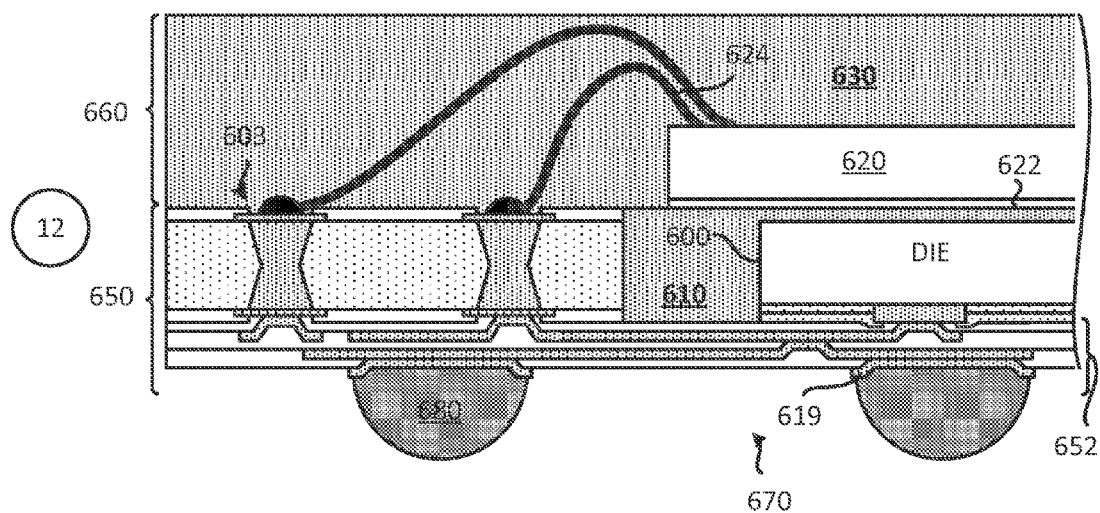

Stage 12, as shown in FIG. 6D, illustrates a state after a solder interconnect 680 (e.g., solder ball) is coupled to the redistribution portion 652 (e.g., the UBM layer 619 of the redistribution portion). In some implementations, the solder interconnect 680 may be coupled earlier in the process. For example, the solder interconnect 680 may be coupled to the redistribution portion 652 after stage 8 of FIG. 6B, in some implementations. In some implementations, the device package 670 may be similar or identical to the device package 200 of FIGS. 2 and/or 3.

Exemplary Sequence for Fabricating a Package Comprising Multiple Dies

In some implementations, providing/fabricating a low profile device package that includes a plurality of dies includes several processes. FIG. 7 (which includes FIGS. 7A-7D) illustrates an exemplary sequence for providing/fabricating a low profile device package that includes a plurality of dies. In some implementations, the sequence of FIGS. 7A-7D may be used to provide/fabricate the device package (e.g., integrated circuit (IC) package) that includes a plurality of dies of FIGS. 4-5 and/or other device packages described in the present disclosure. However, for the purpose of simplification, FIGS. 7A-7D will be described in the context of providing/fabricating the device package of FIG. 5.

It should be noted that the sequence of FIGS. 7A-7D may combine one or more stages in order to simplify and/or clarify the sequence for providing a device package. In some implementations, the order of the processes may be changed or modified.

Figure 7A:
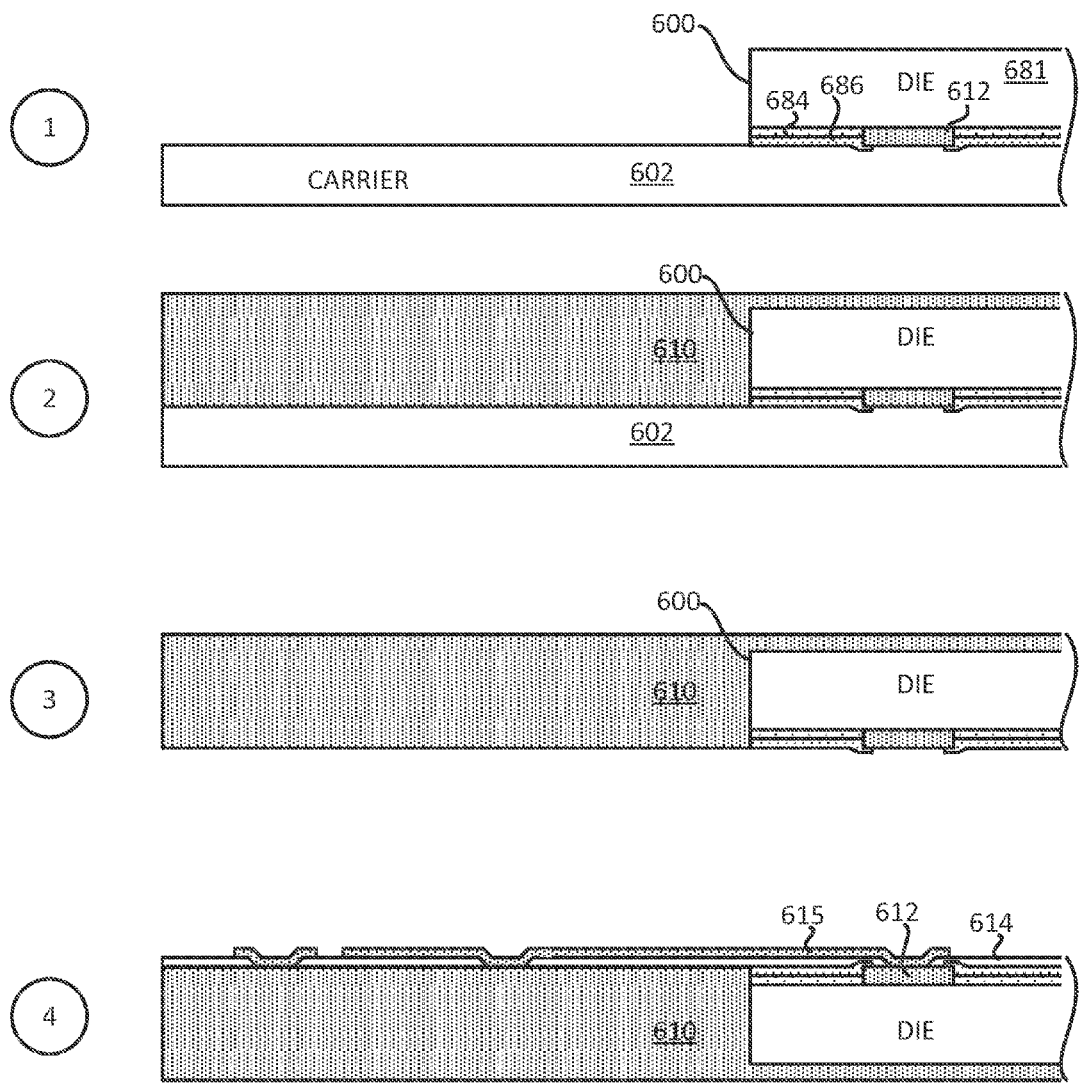
FIG. 7 (which comprises FIGS. 7A-7D) illustrates an example of a sequence for fabricating a low profile package comprising a plurality of dies.

Stage 1, as shown in FIG. 7A, illustrates a state after a second die 600 is coupled (e.g., placed) to a carrier 602. The second die 600 may be identical and/or similar to the second die 250 of FIG. 5. The second die 600 may be a logic die and/or a memory die. The second die 600 may include a substrate portion 681 (e.g., silicon substrate), a third pad 612, a first passivation layer 684, and a second passivation layer 686. The substrate portion 681 may include lower level metal layers and lower level dielectric layers.

Stage 2 illustrates a state after a second encapsulation layer 610 is formed on the second die 600. The second encapsulation layer 610 is formed such that the second encapsulation layer 610 at least partially encapsulates the second die 600. In some implementations, a portion of the second die 600 may be left exposed (e.g., not covered by the second encapsulation layer 610).

Stage 3 illustrates a state after the carrier 602 is decoupled (e.g., detached, removed) from the second die 600 and the second encapsulation layer 610.

Stage 4 illustrates a state after a first dielectric layer 614 and a first redistribution layer 615 are formed. The first dielectric layer 614 may be formed on the second passivation layer 686 of the second die 600. The first redistribution layer 615 is formed such that the first redistribution layer 615 is coupled to the third pad 612 of the second die 600.

Figure 7B:
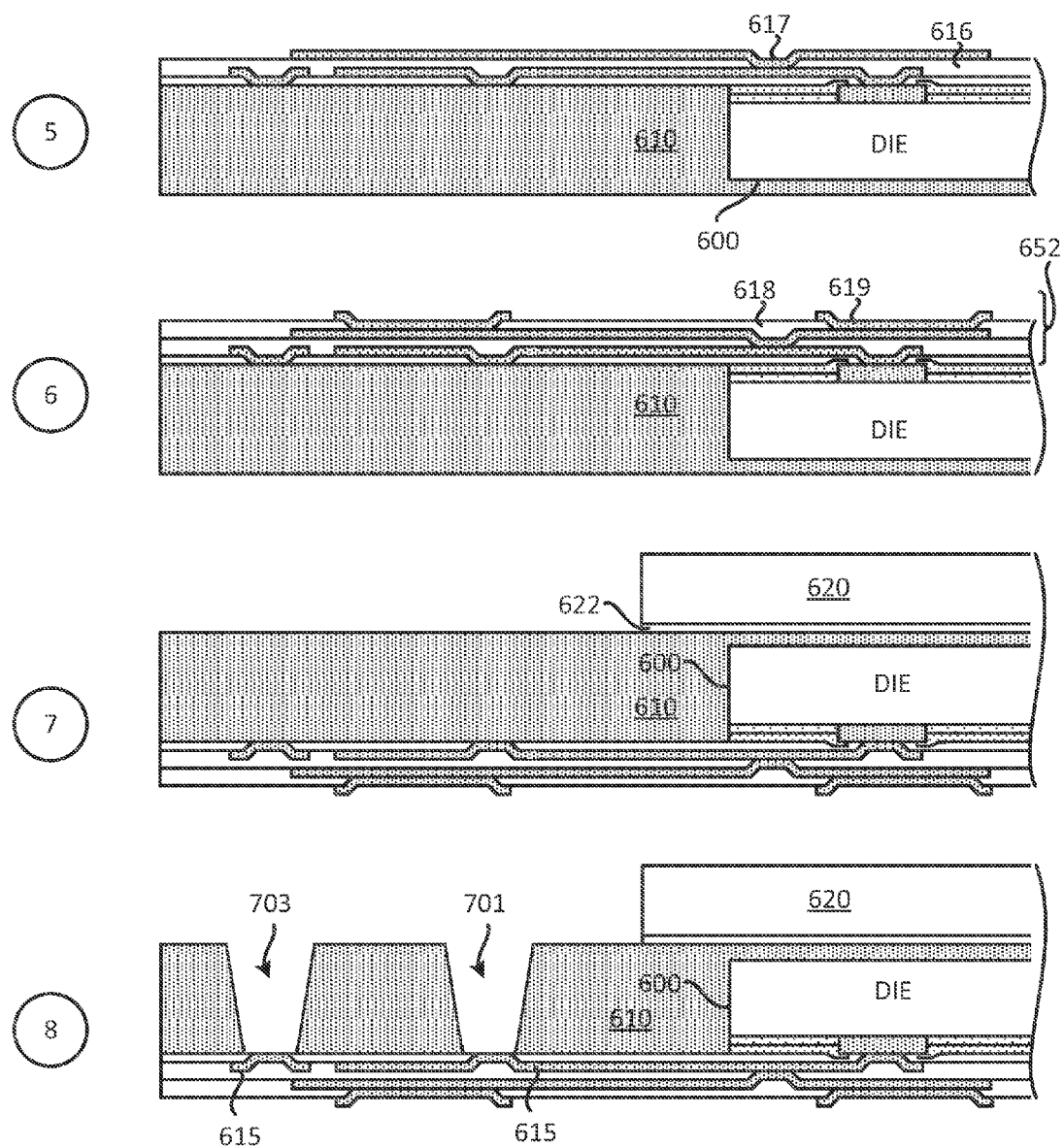

Stage 5, as shown in FIG. 7B, illustrates a state after a second dielectric layer 616 and a second redistribution layer 617 are formed. The second dielectric layer 616 may be formed on the first dielectric layer 614. The second redistribution layer 617 is formed such that the second redistribution layer 617 is coupled to the first redistribution layer 615.

Stage 6 illustrates a state after a third dielectric layer 618 and an under bump metallization (UBM) layer 619 are formed. The third dielectric layer 618 may be formed on the second dielectric layer 616. The UBM layer 619 is formed such that the UBM layer 619 is coupled to the second redistribution layer 617. In some implementations, stages 4-6 of FIGS. 7A-7B, illustrate the fabrication and/or formation of a redistribution portion 652 of a device package (e.g., integrated circuit (IC) package).

Stage 7 illustrates a state after a first die 620 is coupled to the second encapsulation layer 610 through an adhesive 622. In some implementations, the first die 620 may be similar to the first die 210 of FIG. 5. In some implementations, the first die 620 may be coupled to the second die 600 through the adhesive 622. The first die 620 is coupled to the second encapsulation layer 610 such that the first die 620 at least partially overlaps (e.g., vertically overlaps) with the second die 600.

Stage 8 illustrates a state after a first cavity 701 and a second cavity 703 are formed in the second encapsulation layer 610. The first cavity 701 and/or the second cavity 703 may be formed to expose the first redistribution layer 615. Different implementations may form the first cavity 701 and/or the second cavity 703 in the second encapsulation layer 610 differently. In some implementations, a laser process may be used to form and/or create the first cavity 701 and/or the second cavity 703. In some implementations, a lithography process may be used to form and/or create the first cavity 701 and/or the second cavity 703.

Figure 7C:
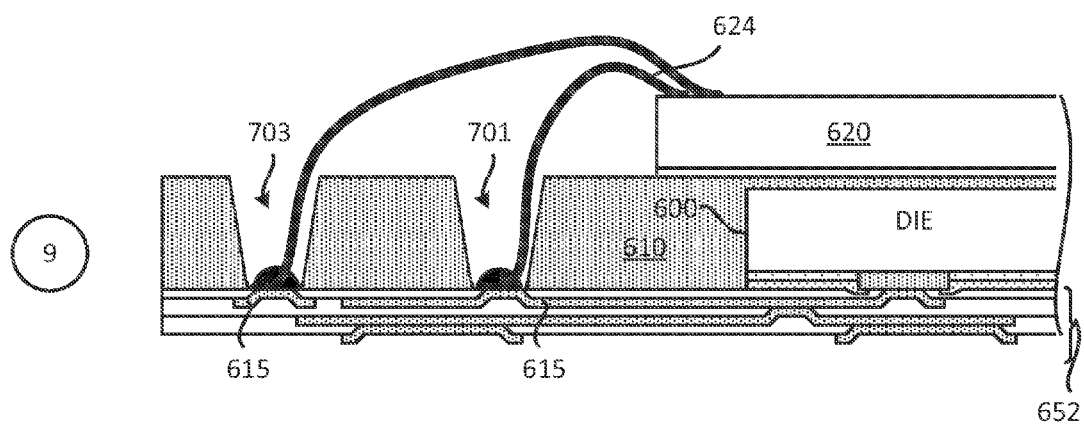
Figure 7C:
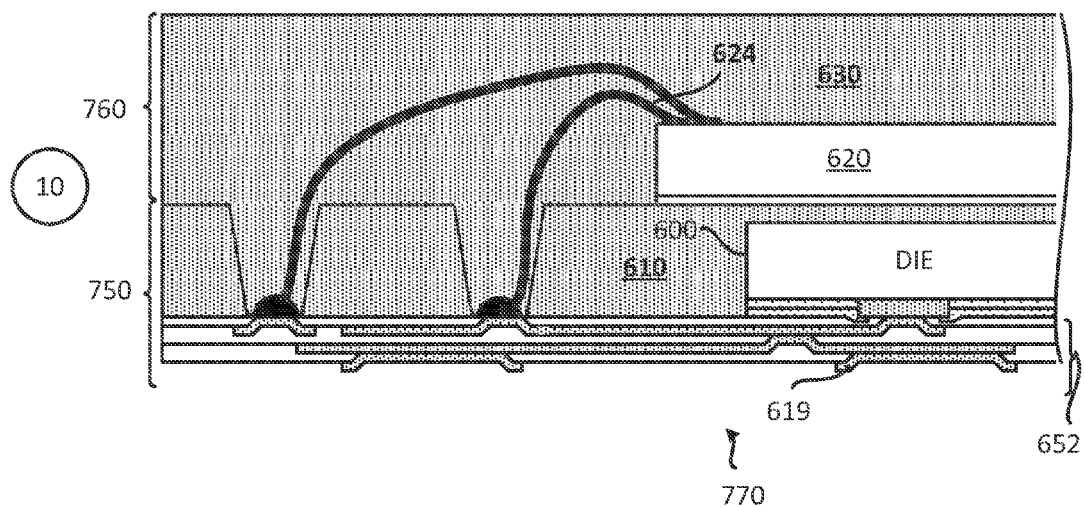

Stage 9, as shown in FIG. 7C, illustrates a state after a wire bond 624 is formed and coupled to the first die 620 and the redistribution portion 652. More specifically, the wire bond 624 is formed and coupled to the first die 620 and the first redistribution layer 615 of the redistribution portion 652.

Stage 10 illustrates a state after a first encapsulation layer 630 is formed on the first die 620 and the wire bond 624. The first encapsulation layer 630 is also formed in the first cavity 701 and the second cavity 703, and is formed over the wire bond 624. In some implementations, stage 10 may illustrate a device package 770 (e.g., integrated circuit (IC) package) that includes a first package portion 750 and a second package portion 760. The first package portion 750 may include the second die 600, the second encapsulation layer 610, and the redistribution portion 652. The second package portion 760 may include the first die 620, the wire bond 624, and the first encapsulation layer 630. The first package portion 750 may also include the first encapsulation layer 630.

Figure 7D:
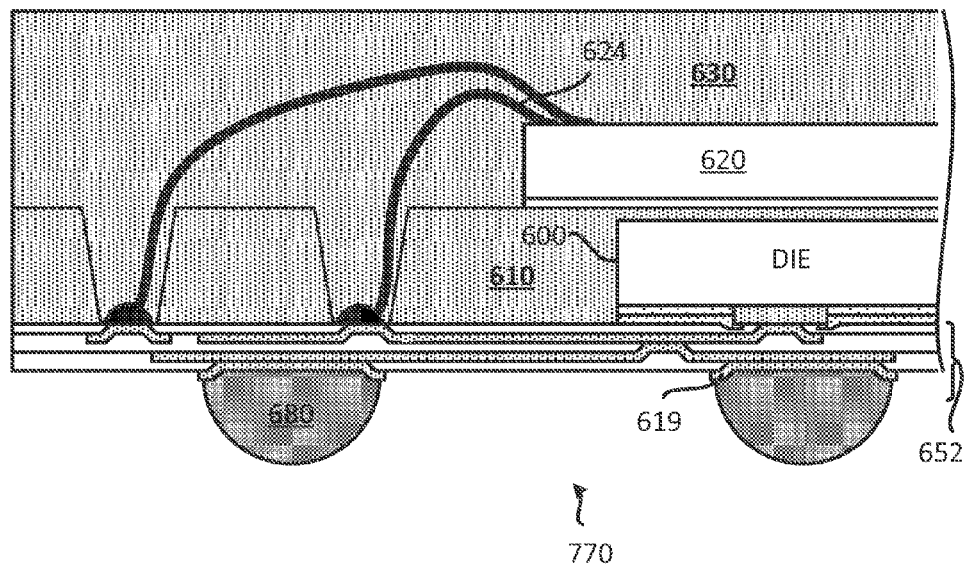

Stage 11, as shown in FIG. 7D, illustrates a state after a solder interconnect 680 (e.g., solder ball) is coupled to the redistribution portion 652 (e.g., the UBM layer 619 of the redistribution portion). In some implementations, the solder interconnect 680 may be coupled earlier in the process. For example, the solder interconnect 680 may be coupled to the redistribution portion 652 after stage 6 of FIG. 7B, in some implementations. In some implementations, the device package 770 may be similar or identical to the device package 400 of FIGS. 4 and/or 5.

Exemplary Low Profile Packages Comprising a Plurality of Dies

Figure 8:
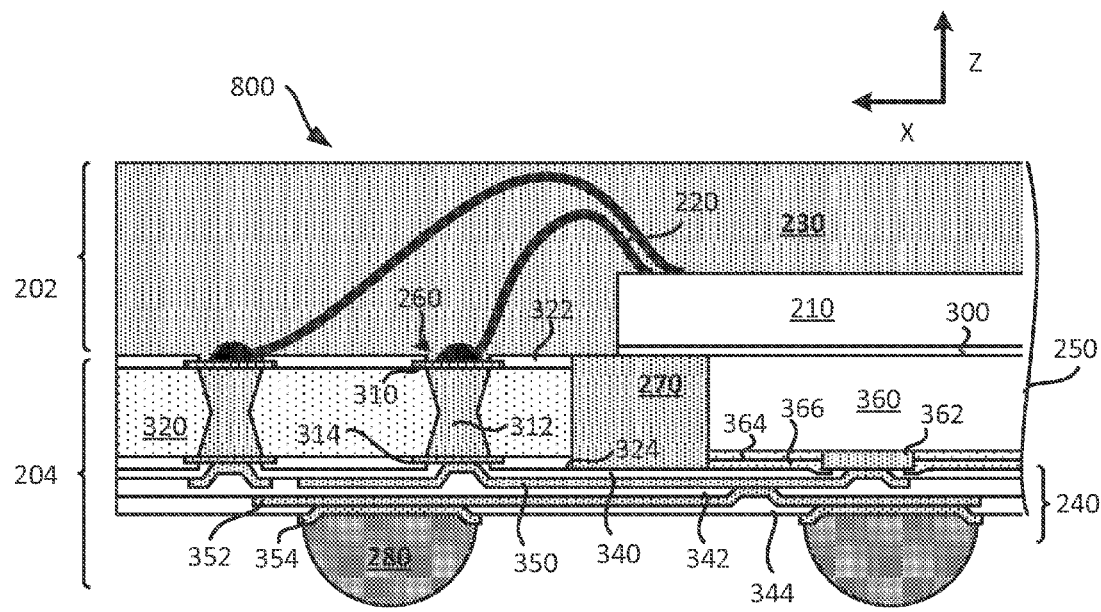
FIG. 8 illustrates a close up cross-sectional view of part of a low profile package comprising a plurality of dies.

FIG. 8 illustrates a device package 800 that includes a plurality of dies. The device package 800 may be an integrated circuit (IC) package. The device package 800 of FIG. 8 is similar to the device package 200 of FIG. 3, except that the top portion of the second die 250 is not covered by the second encapsulation layer 270. Thus, in FIG. 8, the first die 210 is coupled to the second die 250 through the adhesive 300. In some implementations, some portions of the first die 210 may be coupled to the second encapsulation layer 270 through the adhesive 300. In some implementations, the top surface (e.g., back side) of the second die 250 is substantially co-planar with the top surface of the second encapsulation layer 270. Thus, the second die 250 and the second encapsulation layer 270 provide a base and structural support for the first die 210. FIG. 8 illustrates that the first die 210 includes a first portion that vertically overlaps with the second die 250, and a second portion that is supported by the second encapsulation layer 270. The second portion does not vertically overlap with the second die 250.

Figure 9:
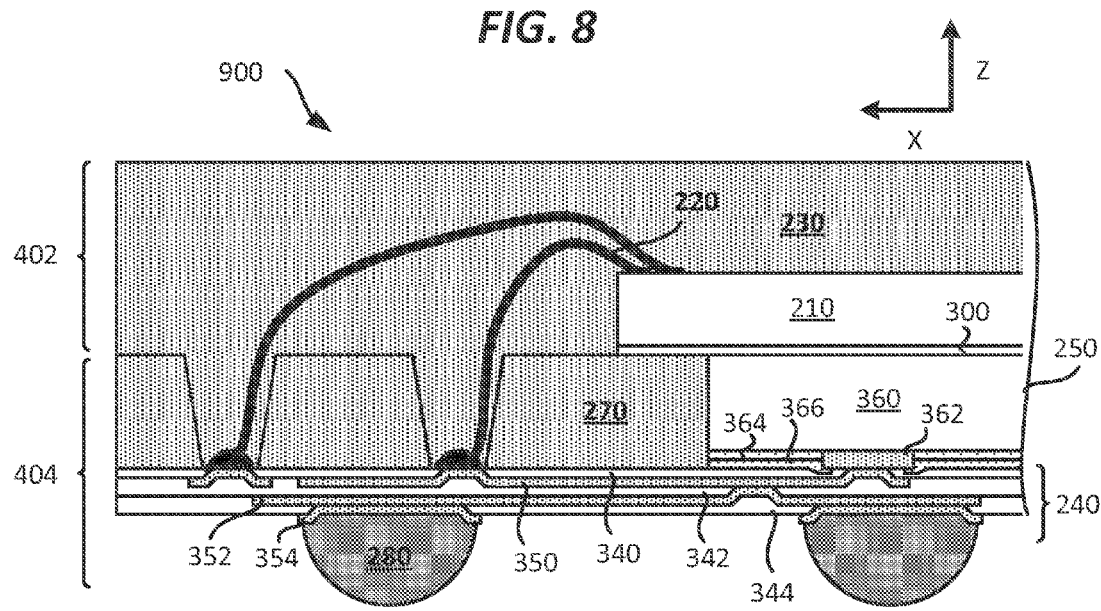
FIG. 9 illustrates a close up cross-sectional view of part of a low profile package comprising a plurality of dies.

FIG. 9 illustrates a device package 900 that includes a plurality of dies. The device package 900 may be an integrated circuit (IC) package. The device package 900 of FIG. 9 is similar to the device package 400 of FIG. 5, except that the top portion of the second die 250 is not covered by the second encapsulation layer 270. Thus, in FIG. 9, the first die 210 is coupled to the second die 250 through the adhesive 300. In some implementations, some portions of the first die 210 may be coupled to the second encapsulation layer 270 through the adhesive 300. As shown in FIG. 9, the top surface (e.g., back side) of the second die 250 is substantially co-planar with the top surface of the second encapsulation layer 270. Thus, the second die 250 and the second encapsulation layer 270 provide a base and structural support for the first die 210.

Figure 10:
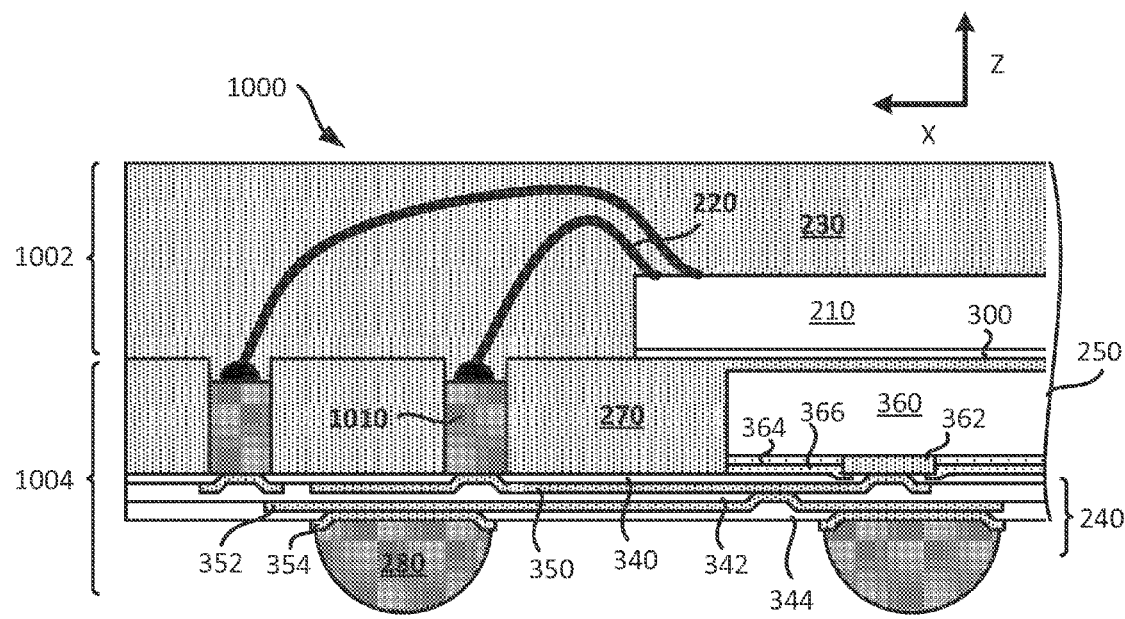
FIG. 10 illustrates a close up cross-sectional view of part of a low profile package comprising a plurality of dies.

FIG. 10 illustrates another device package 1000 that includes a plurality of dies. The device package 1000 may be an integrated circuit (IC) package. The device package 1000 of FIG. 10 is similar to the device package 400 of FIG. 5, except a via is located and/or embedded in the second encapsulation layer 270.

FIG. 10 illustrates that the device package 1000 includes a first package portion 1002 and a second package portion 1004. The first package portion 1002 is coupled to the second package portion 1004 through at least one wire bond 220.

As shown in FIG. 10, the first package portion 1002 includes the first die 210, the wire bond 220 (e.g., at least one wire bond), and the first encapsulation layer 230. The first die 210 is coupled to the wire bond 220. The first encapsulation layer 230 encapsulates (e.g., at least partially encapsulates) the first die 210 and the wire bond 220.

The second package portion 1004 includes the redistribution portion 240, the second die 250, the second encapsulation layer 270, a via 1010, and the solder ball 280. The second package portion 1004 may be a fan out wafer level package (FOWLP). The second die 250 is coupled to the redistribution portion 240. The redistribution portion 240 may be a fan out portion. The via 1010 is coupled to the redistribution portion 240 (e.g., coupled to the first redistribution layer 350 of the redistribution portion 240). The second encapsulation layer 270 at least partially encapsulates the second die 250 and the via 1010.

As shown in FIG. 10, the first package portion 1002 is coupled to the redistribution portion 240 of the second package portion 1004 through the wire bond 220 and the via 1010. The wire bond 220 traverses through a cavity in the second encapsulation layer 270 to couple to the via 1010. The cavity in the second encapsulation layer 270 that includes the wire bond 220 may be filled with the first encapsulation layer 230. The wire bond 220 in the cavity may also be encapsulated by the first encapsulation layer 230.

In some implementations, the first die 210 is electrically coupled to the second die 250 through the wire bond 220, the via 1010 and the redistribution portion 240. Thus, in some implementations, the wire bond 220, the via 1010 and the redistribution portion 240 may provide an electrical path between the first die 210 and the second die 250. In some implementations, the device package 1000 (e.g., integrated circuit (IC) package) includes a circuit that includes the first die 210, the second die 250, the wire bond 220, the via 1010, and the redistribution portion 240.

Figure 11:
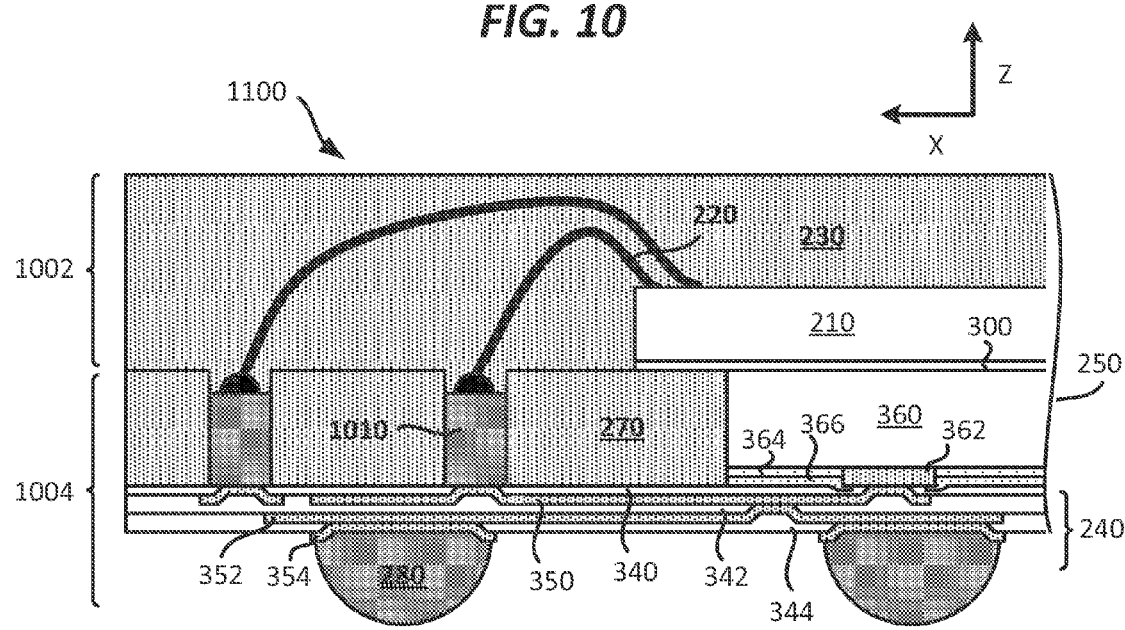
FIG. 11 illustrates a close up cross-sectional view of part of a low profile package comprising a plurality of dies.

FIG. 11 illustrates a device package 1100 that includes a plurality of dies. The device package 1100 may be an integrated circuit (IC) package. The device package 1100 of FIG. 11 is similar to the device package 1000 of FIG. 10, except that the top portion of the second die 250 is not covered by the second encapsulation layer 270. Thus, in FIG. 11, the first die 210 is coupled to the second die 250 through the adhesive 300. In some implementations, some portions of the first die 210 may be coupled to the second encapsulation layer 270 through the adhesive 300. As shown in FIG. 1, the top surface (e.g., back side) of the second die 250 is substantially co-planar with the top surface of the second encapsulation layer 270. Thus, the second die 250 and the second encapsulation layer 270 provide a base and structural support for the first die 210.

It is noted that different implementations may use vias (e.g., via 1010) with different heights. For example, in some implementations, a top surface of the via 1010 may be substantially co-planar with the surface of the second encapsulation layer 270 and/or the surface of the backside of the second die 250.

Exemplary Sequence for Fabricating a Package Comprising a Plurality of Dies

In some implementations, providing/fabricating a low profile device package that includes a plurality of dies includes several processes. FIG. 12 (which includes FIGS. 12A-12D) illustrates an exemplary sequence for providing/fabricating a low profile device package that includes a plurality of dies. In some implementations, the sequence of FIGS. 12A-12D may be used to provide/fabricate the device package (e.g., integrated circuit (IC) package) that includes a plurality of dies of FIGS. 10-11 and/or other device packages described in the present disclosure. However, for the purpose of simplification, FIGS. 12A-12D will be described in the context of providing/fabricating the device package of FIG. 10.

It should be noted that the sequence of FIGS. 12A-12D may combine one or more stages in order to simplify and/or clarify the sequence for providing a device package. In some implementations, the order of the processes may be changed or modified.

Figure 12A:
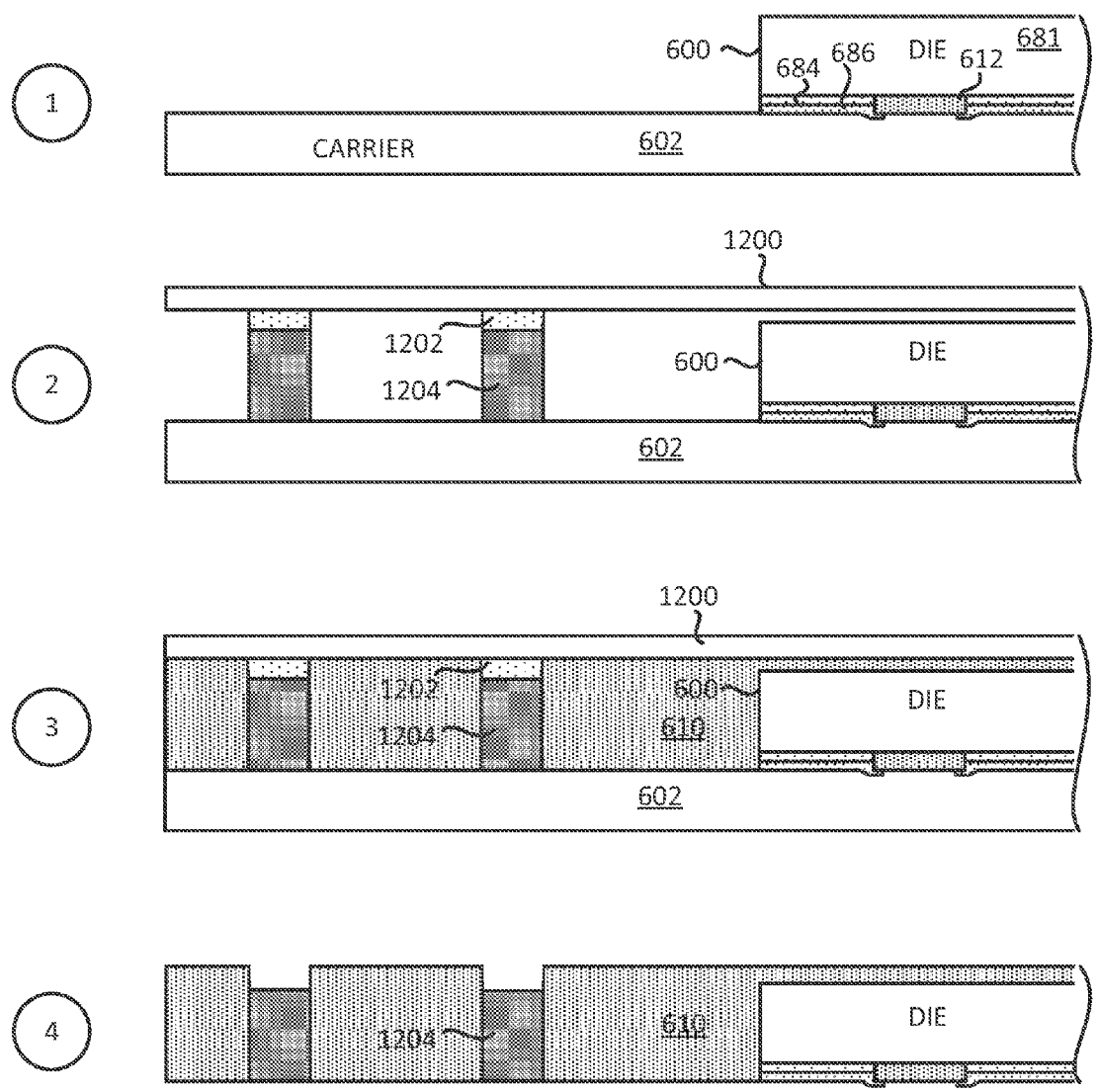
FIG. 12 (which comprises FIGS. 12A-12D) illustrates an example of a sequence for fabricating a low profile package comprising a plurality of dies.

Stage 1, as shown in FIG. 12A, illustrates a state after a second die 600 is coupled (e.g., placed) to a carrier 602. The second die 600 may be identical and/or similar to the second die 250 of FIG. 10. The second die 600 may be a logic die and/or a memory die. The second die 600 may include a substrate portion 681 (e.g., silicon substrate), a third pad 612, a first passivation layer 684, and a second passivation layer 686. The substrate portion 681 may include lower level metal layers and lower level dielectric layers.

Stage 2 illustrates a state after a via 1204 is coupled (e.g., placed) to the carrier 602. In some implementations, the via 1204 is coupled to a sacrificial layer 1202, and the sacrificial layer 1202 is coupled to a temporary adhesive 1200. In some implementations, a plurality of vias and a plurality of sacrificial layers are coupled to the temporary adhesive 1200. Examples of the sacrificial layer 1202 include a photo-sensitive polymer, a dissolvable polymer, a high temp wax, a thermally sensitive polymer, or metal such as nickel (Ni). Different implementations may use different materials for the via 1204. The via 1204 may be electrically conductive columns in some implementations.

Stage 3 illustrates a state after a second encapsulation layer 610 is formed around the second die 600 and around the via 1204 and the sacrificial layer 1202. The second encapsulation layer 610 is formed such that the second encapsulation layer 610 at least partially encapsulates the second die 600, the via 1204 and the sacrificial layer 1202. In some implementations, a portion of the second die 600 may be left exposed (e.g., not covered by the second encapsulation layer 610).

Stage 4 illustrates a state after the carrier 602 is decoupled (e.g., detached, removed) from the second die 600 and the second encapsulation layer 610. Stage 4 also illustrates a state after the temporary adhesive 1200 and the sacrificial layer 1202 are decoupled from the second encapsulation layer 610 and the via 1204.

Figure 12B:
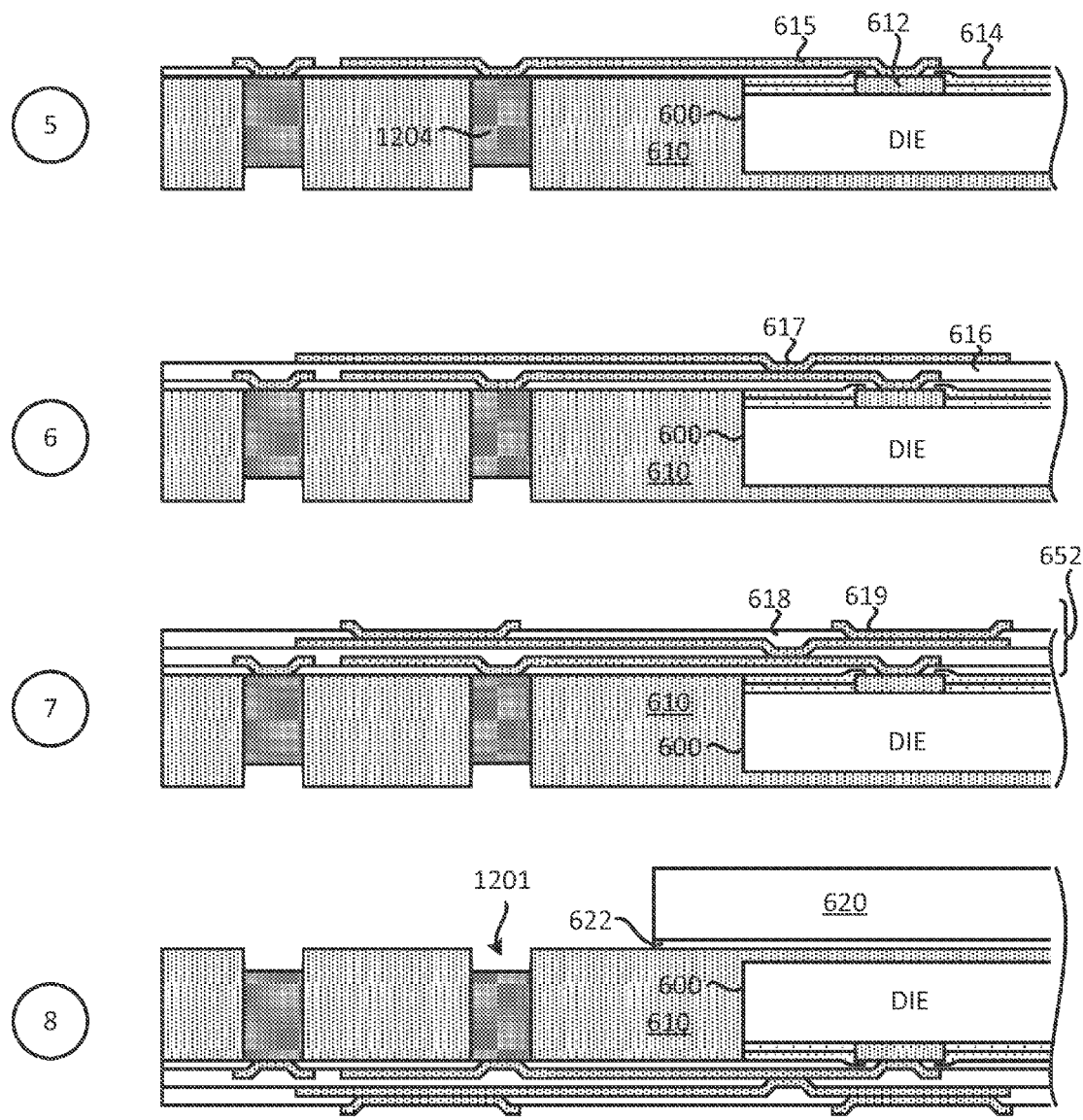

Stage 5, as shown in FIG. 12B, illustrates a state after a first dielectric layer 614 and a first redistribution layer 615 are formed. The first dielectric layer 614 may be formed on the second passivation layer 686 of the second die 600. The first redistribution layer 615 is formed such that the first redistribution layer 615 is coupled to the third pad 612 of the second die 600, and the via 1204.

Stage 6 illustrates a state after a second dielectric layer 616 and a second redistribution layer 617 are formed. The second dielectric layer 616 may be formed on the first dielectric layer 614. The second redistribution layer 617 is formed such that the second redistribution layer 617 is coupled to the first redistribution layer 615.

Stage 7 illustrates a state after a third dielectric layer 618 and an under bump metallization (UBM) layer 619 are formed. The third dielectric layer 618 may be formed on the second dielectric layer 616. The UBM layer 619 is formed such that the UBM layer 619 is coupled to the second redistribution layer 617. In some implementations, stages 5-7 of FIG. 12B, illustrate the fabrication and/or formation of a redistribution portion 652 of a device package (e.g., integrated circuit (IC) package).

Stage 8 illustrates a state after a first die 620 is coupled to the second encapsulation layer 610 through an adhesive 622. In some implementations, the first die 620 may be similar to the first die 210 of FIG. 5. In some implementations, the first die 620 may be coupled to the second die 600 through the adhesive 622. The first die 620 may at least partially overlap (e.g., vertically overlap) with the second die 600.

Figure 12C:
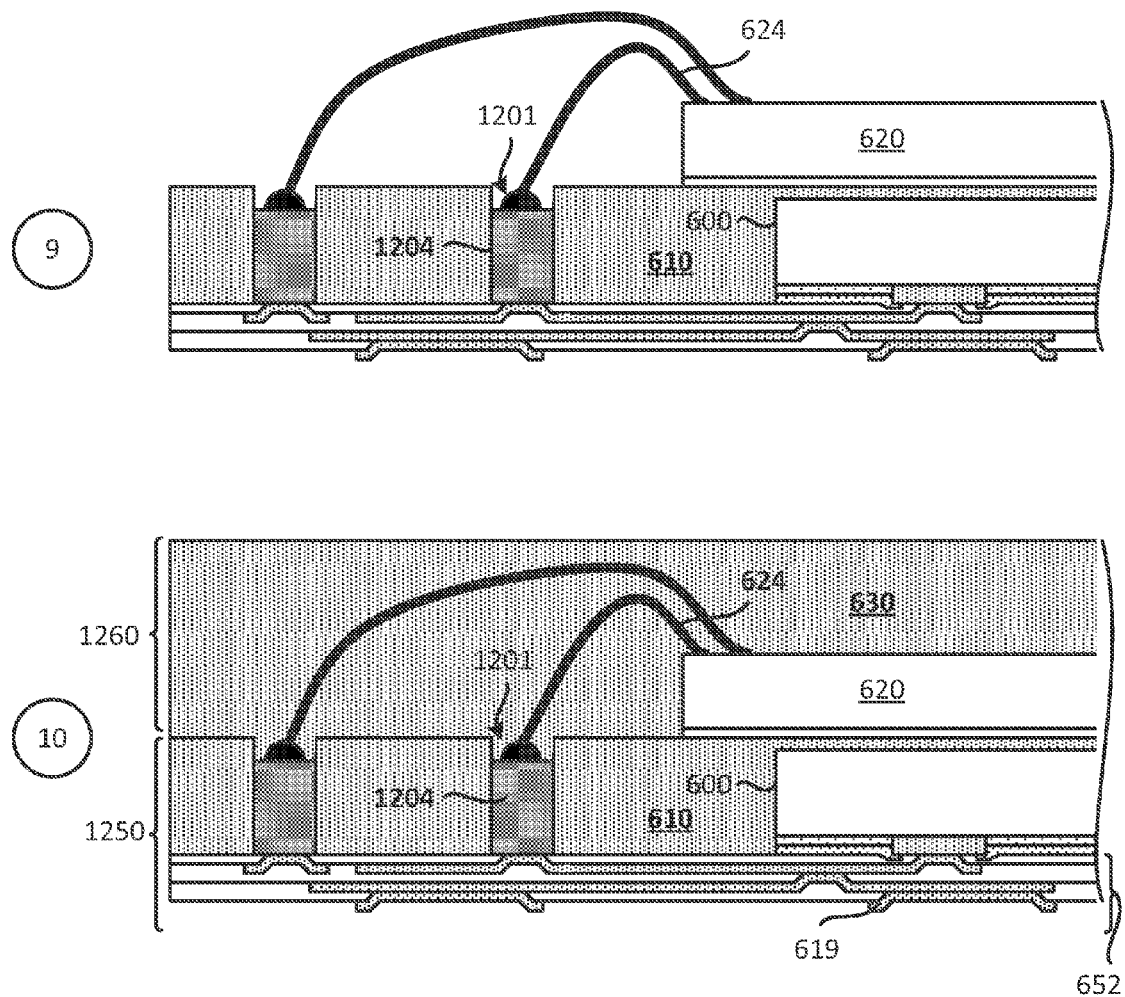

Stage 9, as shown in FIG. 12C, illustrates a state after a wire bond 624 is formed and coupled to the first die 620 and the via 1204.

Stage 10 illustrates a state after a first encapsulation layer 630 is formed on the first die 620 and the wire bond 624. The first encapsulation layer 630 is also formed in the first cavity 1201. In some implementations, stage 10 may illustrate a device package 1270 (e.g., integrated circuit (IC) package) that includes a first package portion 1250 and a second package portion 1260. The first package portion 1250 may include the second die 600, the second encapsulation layer 610, the via 1204, and the redistribution portion 652. The second package portion 1260 may include the first die 620, the wire bond 624, and the first encapsulation layer 630. The first package portion 1250 may also include the first encapsulation layer 630.

Figure 12D:
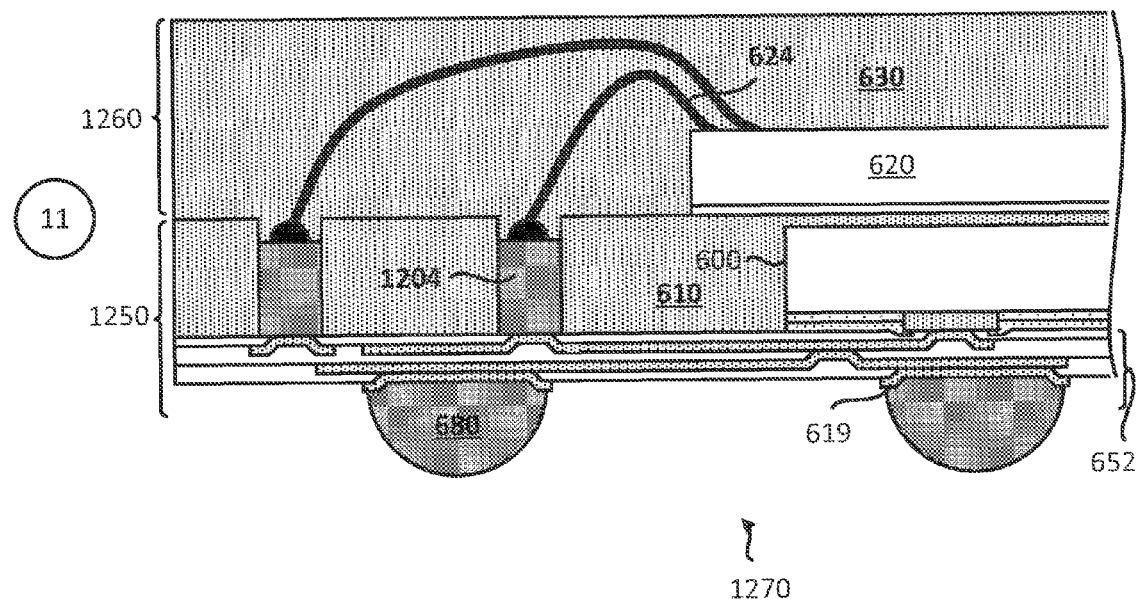

Stage 11, as shown in FIG. 12D, illustrates a state after a solder interconnect 680 (e.g., solder ball) is coupled to the redistribution portion 652 (e.g., the UBM layer 619 of the redistribution portion). In some implementations, the solder interconnect 680 may be coupled earlier in the process. For example, the solder interconnect 680 may be coupled to the redistribution portion 652 after stage 7 of FIG. 12B, in some implementations. In some implementations, the device package 1270 (e.g., integrated circuit (IC) package) may be similar or identical to the device package 1000 of FIG. 10.

Exemplary Method for Fabricating a Package Comprising a Plurality of Dies

Figure 13:
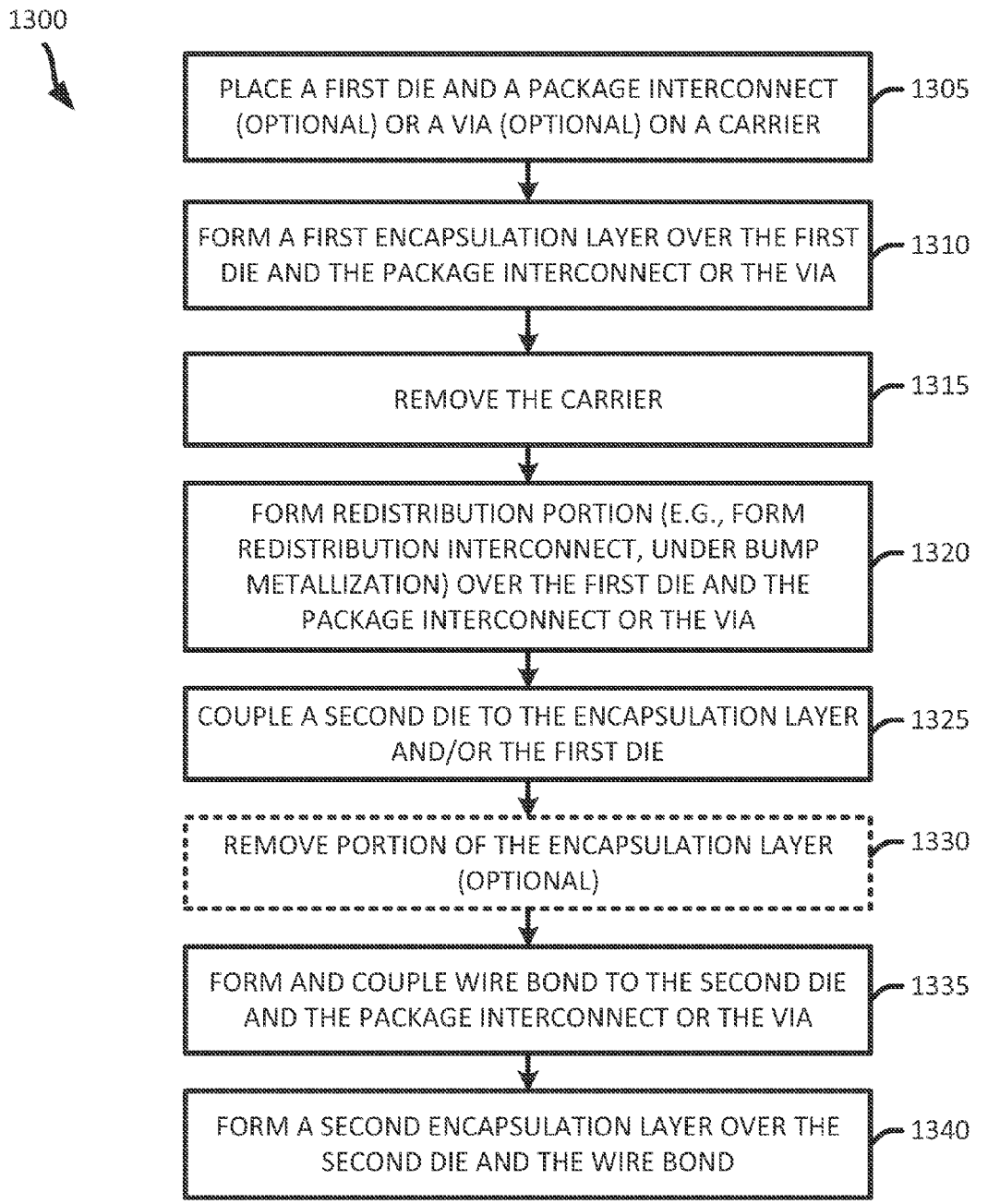
FIG. 13 illustrates a flow diagram of an exemplary method for fabricating a low profile package comprising a plurality of dies.

In some implementations, providing/fabricating a low profile device package that includes a plurality of dies includes several processes. FIG. 13 illustrates an exemplary flow diagram of a method for providing/fabricating a low profile device package that includes a plurality of dies. In some implementations, the method of FIG. 13 may be used to provide/fabricate the device package (e.g., integrated circuit (IC) package) of FIGS. 2-5 and/or other device packages described in the present disclosure. However, for the purpose of simplification, FIG. 13 will be described in the context of providing/fabricating the device package of FIG. 3.

It should be noted that the flow diagram of FIG. 13 may combine one or more processes in order to simplify and/or clarify the method for providing a device package. In some implementations, the order of the processes may be changed or modified.

The method places (at 1305) a die on a carrier. The die may be identical and/or similar to the second die 250 of FIG. 3. The die may be a logic die and/or a memory die. The die may include a substrate portion (e.g., silicon substrate), a pad, a first passivation layer, and a second passivation layer. The method may also optionally place (at 1305) a package interconnect or a via on the carrier. The package interconnect may be identical and/or similar to the package interconnect 260 of FIG. 3. The via may be identical and/or similar to the via 1010 of FIG. 10.

The method forms (at 1310) an encapsulation layer over the die and the package interconnect or the via. The encapsulation layer is formed such that the encapsulation layer at least partially encapsulates the die, the package interconnect or the via. The encapsulation layer may be the second encapsulation layer 270 or the second encapsulation layer 610.

The method then removes (at 1315) the carrier from the die, the package interconnect, the via and/or the encapsulation layer. The carrier may be the carrier 602.

The method forms (at 1320) a redistribution portion over the die and the package interconnect. In some implementations, forming the redistribution portion includes forming a first dielectric layer, forming a first redistribution layer (e.g., forming metal layers, vias, or pads), forming a second dielectric layer, forming a second redistribution layer (e.g., forming metal layers, vias, or pads), forming a third dielectric layer and/or forming an under bump metallization (UBM) layer. The redistribution portion may be the redistribution portion 240, or the redistribution portion 652.

The method couples (at 1325) a second die to the encapsulation layer and/or the die. In some implementations, an adhesive may be used to couple the second die to the encapsulation layer and/or the die. The second die may be the first die 210 or the first die 620.

The method optionally removes (at 1330) a portion of the encapsulation layer. In some implementations, removing a portion of the encapsulation layer includes using a laser process (e.g., laser ablation) to remove portions of the encapsulation layer. In some implementations, removing a portion of the encapsulation layer includes using a lithography process to remove portions of encapsulation layer.

The method forms and couples (at 1335) a wire bond to the second die and the package interconnect or the via. In instances where there is no package interconnect or no via, the method may form and couple (at 1335) the wire bond to the second die and the redistribution portion (e.g., redistribution layer of the redistribution portion). The wire bond may be the wire bond 220 or the wire bond 624.

The method then forms (at 1340) a second encapsulation layer on the second die and the wire bond. In some implementations, the second encapsulation layer may be formed in cavities of the first encapsulation layer. The second encapsulation layer may be the first encapsulation layer 230, or the first encapsulation layer 630.

Exemplary Low Profile Package Comprising a Plurality of Dies

Figure 14:
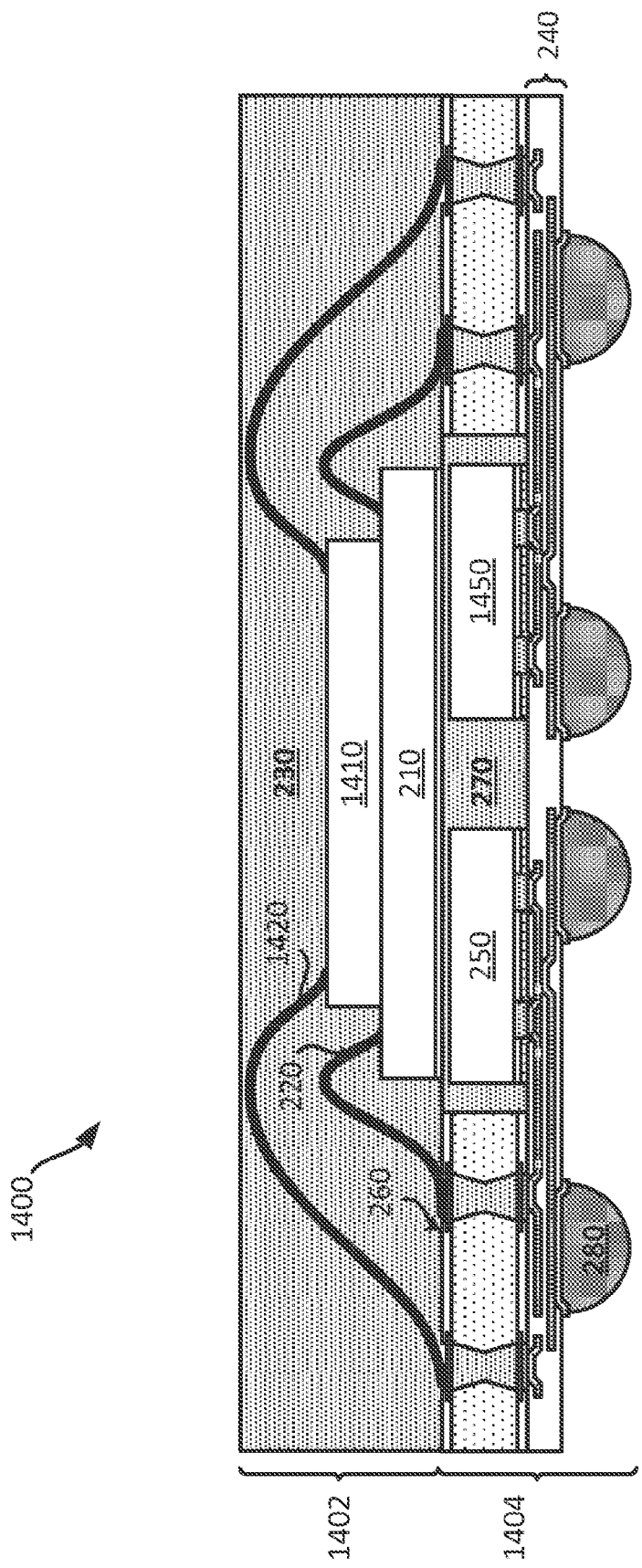
FIG. 14 illustrates a cross-sectional view of another example of a low profile package comprising a plurality of dies.

FIG. 14 illustrates a device package 1400 that includes a plurality of dies. The device package 1400 may be an integrated circuit (IC) package. The device package 1400 of FIG. 14 is similar to the device package 200 of FIG. 2, except that the device package 1400 includes more dies.

The device package 1400 includes a first package portion 1402 and a second package portion 1404. The first package portion 1402 is coupled to the second package portion 1404 through at least one wire bond 220 and at least one second wire bond 1420.

As shown in FIG. 14, the first package portion 1402 includes the first die 210, a third die 1410, the wire bond 220 (e.g., at least one wire bond), the second wire bond 1420 and the first encapsulation layer 230. The first die 210 is coupled to the wire bond 220. The third die 1410 is coupled to the second wire bond 1420. The first encapsulation layer 230 encapsulates (e.g., at least partially encapsulates) the first die 210, the third die 1410, the wire bond 220 and the second wire bond 1420. The third die 1410 is coupled (e.g., mounted) on the first die 210 (e.g., through an adhesive). However, in some implementations, the third die 1410 may be co-planar with the first die 210. That is, the third die 1410 may be coupled (e.g., mounted) on the second encapsulation layer 270 and/or the second die 250.

The second package portion 1404 includes the redistribution portion 240, the second die 250, the package interconnect 260, a fourth die 1450, the second encapsulation layer 270, and the solder ball 280. The second die 250 and the fourth die 1450 are coupled to the redistribution portion 240. The second die 250 and the fourth die 1450 may be co-planar to each other. The redistribution portion 240 may be a fan out portion. The second encapsulation layer 270 at least partially encapsulates the second die 250 and the fourth die 1450. The wire bond 220 and the second wire bond 1420 are coupled to the package interconnect 260 (e.g., pads of the package interconnects).

In some implementations, the device package 1400 may also include electronic components. Examples of electronic components include a radio frequency (RF) filter, a power amplifier and a passive device (e.g., capacitor, inductor). These electronic components may be located in the first package portion 1402 and/or the second package portion 1404. These electronic components may be electrically coupled in the device package 1400 in a similar manner as the dies. For example these electronic components may be electrically coupled through wire bond. These electronic components may be encapsulated by the first encapsulation layer 230 and/or the second encapsulation layer 270. For example, any of the dies described in the device package 1400 may be replaced by an electronic component. As an example, an electronic component may be coupled to a top portion of the second encapsulation layer 270 and/or a top surface of the second die 250. In a similar manner, it is noted that any of the device packages described in the present disclosure may include at least one electronic component (e.g., radio frequency (RF) filter, power amplifier, passive device).

FIG. 14 illustrates one example of a device package (e.g., integrated circuit (IC) package) that includes more than two dies. It is noted that any of the device packages (e.g., integrated circuit (IC) packages) described in the present disclosure may be modified to include more than two dies. For example, the device packages 400, 800, 900, 1000, and/or 1100 may be modified in a similar manner to include more than two dies and/or include at least one electronic component (e.g., radio frequency (RF) filter, power amplifier, passive device).

Exemplary Electronic Devices

Figure 15:
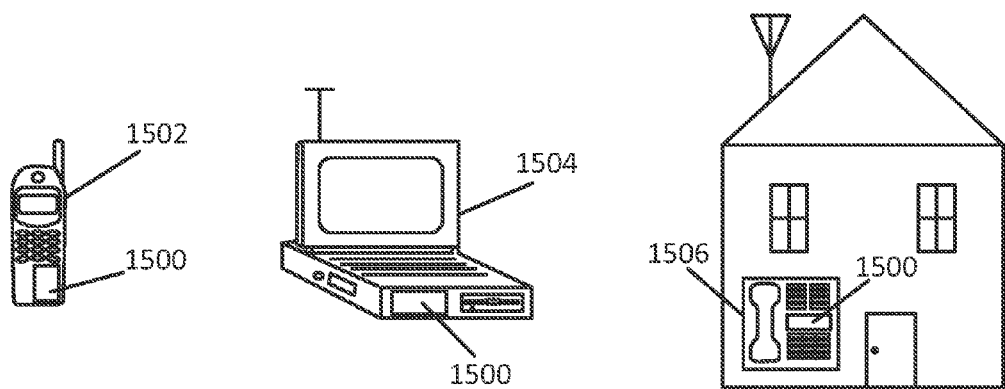
FIG. 15 illustrates various electronic devices that may include the various integrated devices, integrated device packages, semiconductor devices, dies, integrated circuits, and/or packages described herein.

FIG. 15 illustrates various electronic devices that may be integrated with any of the aforementioned integrated device, semiconductor device, integrated circuit, die, interposer, package or package-on-package (PoP). For example, a mobile phone device 1502, a laptop computer device 1504, and a fixed location terminal device 1506 may include an integrated device 1500 as described herein. The integrated device 1500 may be, for example, any of the integrated circuits, dies, integrated devices, integrated device packages, integrated circuit devices, device packages, integrated circuit (IC) packages, package-on-package devices described herein. The devices 1502, 1504, 1506 illustrated in FIG. 15 are merely exemplary. Other electronic devices may also feature the integrated device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6A-6D, 7A-7D, 8, 9, 10, 11, 12A-12D, 13, 14 and/or 15 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6A-6D, 7A-7D, 8, 9, 10, 11, 12A-12D, 13, 14 and/or 15 and its corresponding description in the present disclosure is not limited to dies and/or ICs. In some implementations, FIGS. 2, 3, 4, 5, 6A-6D, 7A-7D, 8, 9, 10, 11, 12A-12D, 13, 14 and/or 15 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated circuit (IC) package comprising:
a first die;
a wire bond coupled to the first die;
a first encapsulation layer that at least partially encapsulates the first die and the wire bond;
a second die;
a package interconnect comprising a first pad, the package interconnect being substantially co-planar to the second die, wherein the first pad comprises a first surface that is coupled to the wire bond, and the first surface has a surface roughness $R_a$ value that is about 1 micron (μm) or less;
a redistribution portion coupled to the second die and the package interconnect; and
a second encapsulation layer that at least partially encapsulates the second die and the package interconnect.

2. The integrated circuit (IC) package of claim 1, wherein the wire bond is indirectly coupled to the redistribution portion through the package interconnect.

3. The integrated circuit (IC) package of claim 2, wherein a surface of the second encapsulation layer is substantially co-planar with a surface of the package interconnect.

4. The integrated circuit (IC) package of claim 2, wherein the package interconnect comprises:
a dielectric layer;
a first via traversing the dielectric layer, wherein the first via is coupled to the first pad; and
a second pad coupled to the first via.

5. The integrated circuit (IC) package of claim 2, wherein the package interconnect comprises a package interconnect selected from a group of interconnects consisting of a printed circuit board (PCB) bar, a preformed through substrate via (TSV) bar, and an in-situ plated metal interconnect.

6. The integrated circuit (IC) package of claim 1, wherein the integrated circuit (IC) package has a height of about 500 microns (μm) or less.

7. The integrated circuit (IC) package of claim 1, wherein the first die is at least partially coupled to the second encapsulation layer.

8. The integrated circuit (IC) package of claim 1, wherein the first die is at least partially coupled to the second die.

9. The integrated circuit (IC) package of claim 1, wherein the first die is at least partially coupled to the second encapsulation layer through an adhesive.

10. The integrated circuit (IC) package of claim 1, wherein the first die comprises:
a first portion that vertically overlaps with the second die; and
a second portion that is vertically non-overlapping with the second die, wherein the second portion is supported by the second encapsulation layer.

11. The integrated circuit (IC) package of claim 1, wherein the redistribution portion include a first redistribution layer.

12. The integrated circuit (IC) package of claim 1, wherein the integrated circuit (IC) package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

13. An integrated circuit (IC) package comprising:
a first die;
a wire bond coupled to the first die;
a first encapsulation layer that at least partially encapsulates the first die and the wire bond;
a second die;
means for interconnecting package portions coupled to the wire bond, the means for interconnecting package portions being substantially co-planar to the second die, wherein the means for interconnecting package portions comprises a first pad, the first pad includes a first surface that is coupled to the wire bond, and the first surface has a surface roughness $R_a$ value that is about 1 micron ($\mu$m) or less;
a redistribution portion coupled to the second die and the means for interconnecting package portions; and
a second encapsulation layer that at least partially encapsulates the second die and the means for interconnecting package portions.

14. The integrated circuit (IC) package of claim 13, wherein the means for interconnecting package portions comprises a package interconnect selected from a group of interconnects consisting of a printed circuit board (PCB) bar, a preformed through substrate via (TSV) bar, and an in-situ plated metal interconnect.

15. The integrated circuit (IC) package of claim 13, wherein the means for interconnecting package portions comprises a via.

16. The integrated circuit (IC) package of claim 13 further comprising:
a third die; and
a second wire bond coupled to the third die and the means for interconnecting package portions, wherein the first encapsulation layer at least partially encapsulates the third die and the second wire bond.

17. The integrated circuit (IC) package of claim 13 further comprising a third die coupled to the redistribution portion, wherein the second encapsulation layer at least partially encapsulates the third die.

18. The integrated circuit (IC) package of claim 13 further comprising at least one electronic component.

19. The integrated circuit (IC) package of claim 18 wherein the at least one electronic component is at least partially encapsulated by the first encapsulation layer.

20. The integrated circuit (IC) package of claim 18 wherein the at least one electronic component is at least partially encapsulated by the second encapsulation layer.

21. The integrated circuit (IC) package of claim 18, wherein the at least one electronic component is from a group of electronic components comprising a radio frequency (RF) filter, a power amplifier and a passive device.

22. A method for fabricating an integrated circuit (IC) package, comprising
providing a second die;
providing a package interconnect comprising a first pad, the package interconnect is provided such that the package interconnect is substantially co-planar to the second die, wherein the first pad comprises a first surface that has a surface roughness $R_a$ value that is about 1 micron ($\mu$m) or less;
forming a second encapsulation layer that at least partially encapsulates the second die and the package interconnect;
forming a redistribution portion over the second die, over the second encapsulation layer, and over the package interconnect;
providing a first die;
forming a wire bond and coupling the wire bond to the first die and the first surface of the first pad; and
forming a first encapsulation layer that at least partially encapsulates the first die and the wire bond.

23. The method of claim 22, wherein providing the first die comprises providing the first die at least partially over the second die.

24. The method of claim 22, wherein providing the first die comprises providing the first die at least partially over the second encapsulation layer.

25. The method of claim 22, wherein providing the package interconnect comprises:
forming a dielectric layer;
forming a first via in the dielectric layer;
forming the first pad and coupling the first pad to the first via; and
forming a second pad and coupling the second pad to the first via.

26. The method of claim 22, wherein forming the second encapsulation layer that at least partially encapsulates the second die comprises forming a litho patternable layer that at least partially encapsulates the second die.

27. The method of claim 22, wherein providing the package interconnect comprises providing the package interconnect that includes a sacrificial layer over the first pad.

28. The method of claim 27, further comprising removing the sacrificial layer over the first pad.

29. The integrated circuit (IC) package of claim 1, wherein the wire bond is coupled to the first pad such that the wire bond is touching the first pad of the package interconnect.

30. The integrated circuit (IC) package of claim 13, wherein the wire bond is coupled to the first pad such that the wire bond is touching the first pad of the means for interconnecting package portions.

* * * * *